United States Patent
Hsu et al.

(10) Patent No.: US 11,854,851 B2
(45) Date of Patent: Dec. 26, 2023

(54) INTERFACE TOOL

(71) Applicant: Taiwan Semiconductor Manufacturing Company, Ltd., Hsinchu (TW)

(72) Inventors: Jyh-Shiou Hsu, Hsin-Chu (TW); Chyi-Tsong Ni, Hsin-Chu (TW); Mu-Tsang Lin, Hemei Township (TW); Su-Horng Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/249,568

(22) Filed: Mar. 5, 2021

(65) Prior Publication Data
US 2022/0285192 A1 Sep. 8, 2022

(51) Int. Cl.
*H01L 21/677* (2006.01)
*H01L 21/687* (2006.01)
*F24F 9/00* (2006.01)

(52) U.S. Cl.
CPC .......... *H01L 21/67772* (2013.01); *F24F 9/00* (2013.01); *H01L 21/67766* (2013.01); *H01L 21/67778* (2013.01); *H01L 21/68707* (2013.01); *F24F 2009/005* (2013.01)

(58) Field of Classification Search
CPC .......... H01L 21/67772; H01L 21/67778; F24F 9/00; F24F 2009/005
See application file for complete search history.

(56) References Cited

U.S. PATENT DOCUMENTS

| | | | |
|---|---|---|---|
| 2004/0168742 A1* | 9/2004 | Kim | H01L 21/67017 141/98 |
| 2006/0169208 A1 | 8/2006 | Shinozaki et al. | |
| 2010/0112225 A1* | 5/2010 | Sato | H01L 21/6776 118/58 |
| 2015/0045961 A1* | 2/2015 | Koshti | H01L 21/67207 700/276 |
| 2015/0170945 A1* | 6/2015 | Segawa | H01L 21/67778 414/217 |
| 2018/0148834 A1* | 5/2018 | Kamimura | C23C 16/45589 |
| 2019/0374985 A1* | 12/2019 | Ko | B08B 15/02 |
| 2019/0375587 A1* | 12/2019 | Kusama | H01L 21/67775 |
| 2020/0073258 A1* | 3/2020 | Chiu | H01L 21/67288 |
| 2022/0037184 A1* | 2/2022 | Taniyama | H01L 21/67393 |

* cited by examiner

*Primary Examiner* — Gerald McClain
(74) *Attorney, Agent, or Firm* — Harrity & Harrity, LLP

(57) ABSTRACT

A closed gas circulation system may include a sealed plenum, circulation fans, and a fan filter unit (FFU) inlet to contain, filter, condition, and re-circulate a gas through a chamber of an interface tool. The gas provided to the chamber is maintained in a conditioned environment in the closed gas circulation system as opposed to introducing external air into the chamber through the FFU inlet. This enables precise control over the relative humidity and oxygen concentration of the gas used in the chamber, which reduces the oxidation of semiconductor wafers that are transferred through the chamber. The closed gas circulation system may also include an air-flow rectifier, a return vent, and one or more vacuum pumps to form a downflow of collimated gas in the chamber and to automatically control the feed-forward pressure and flow of gas through the chamber and the sealed plenum.

19 Claims, 25 Drawing Sheets

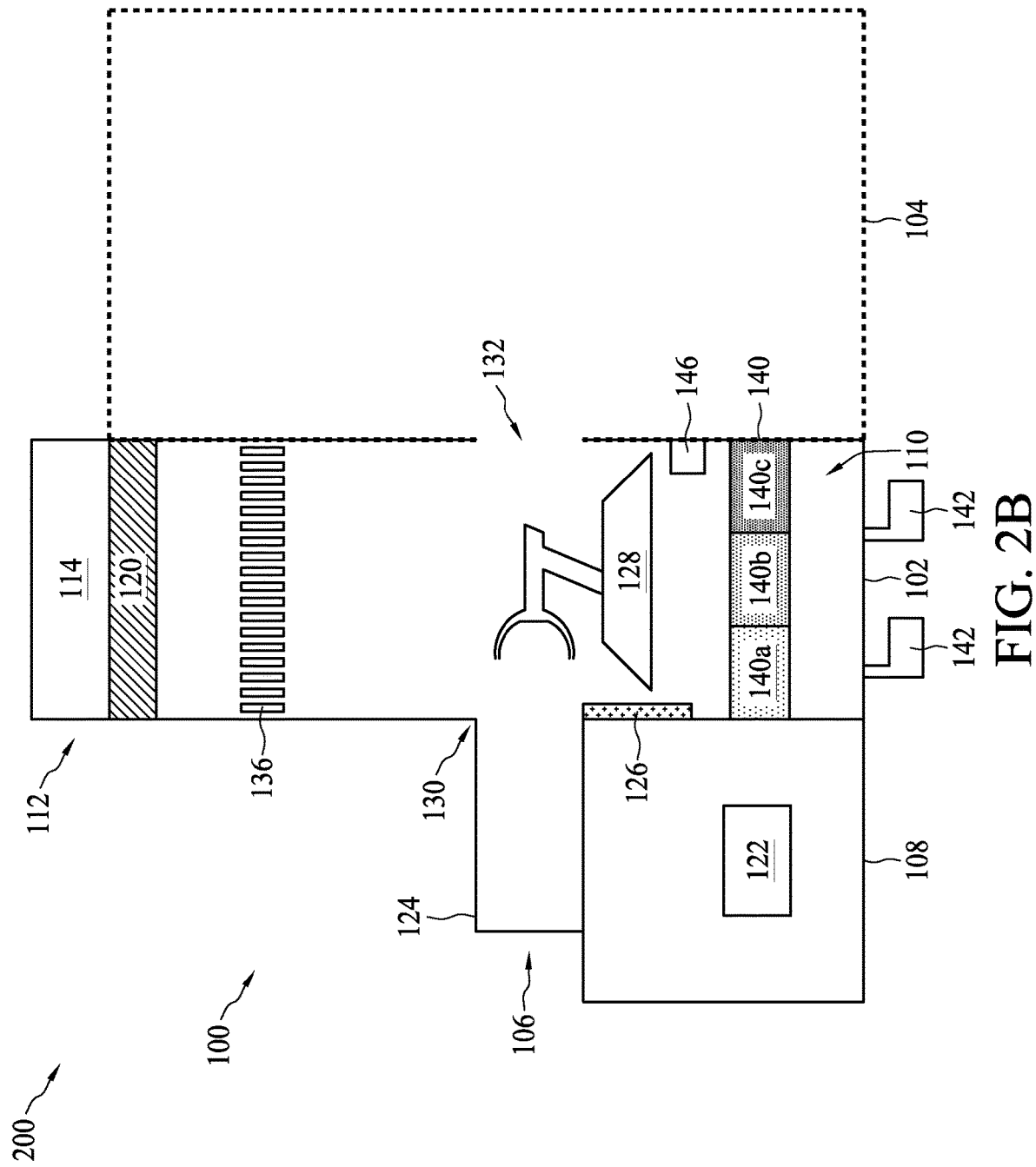

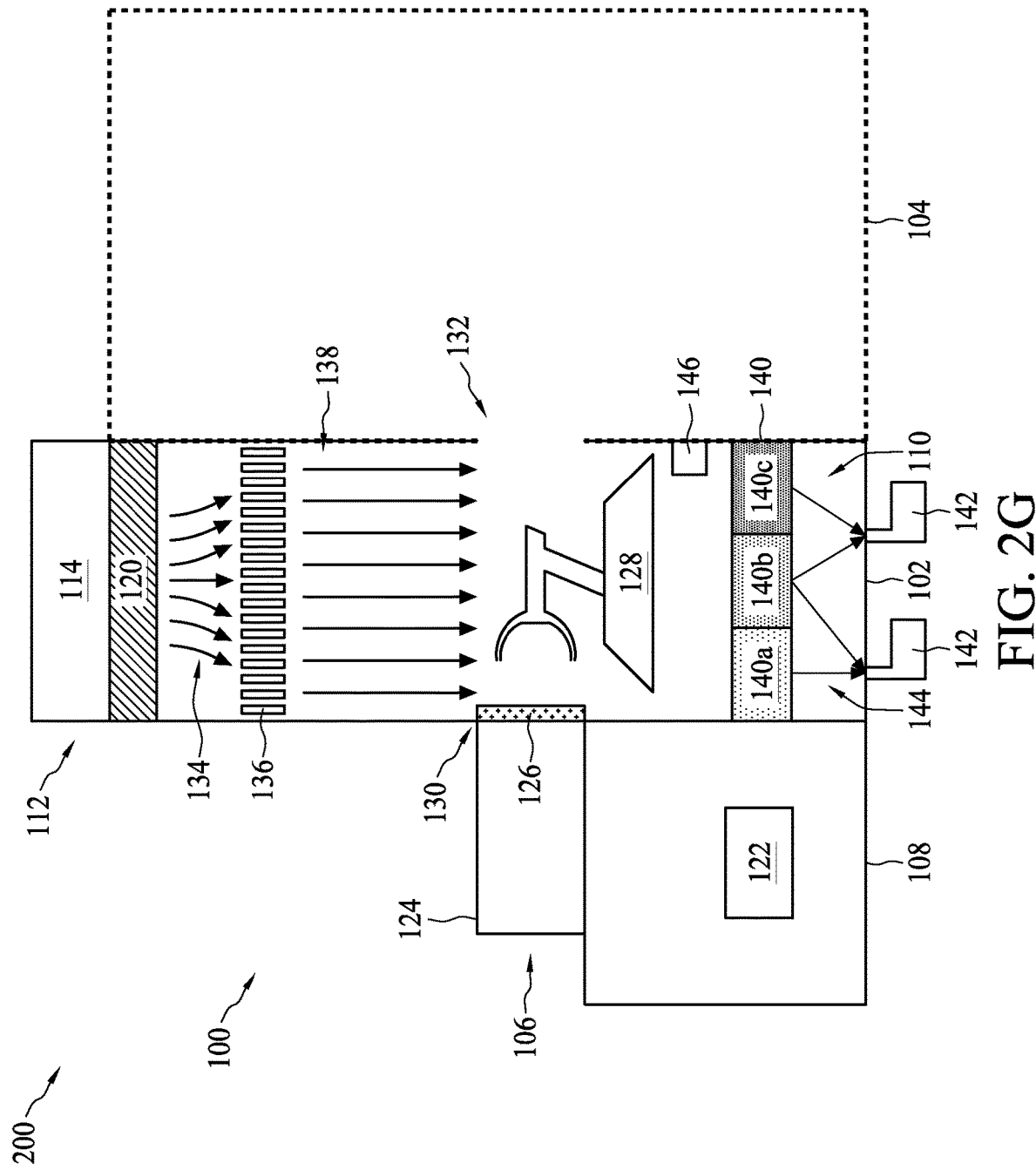

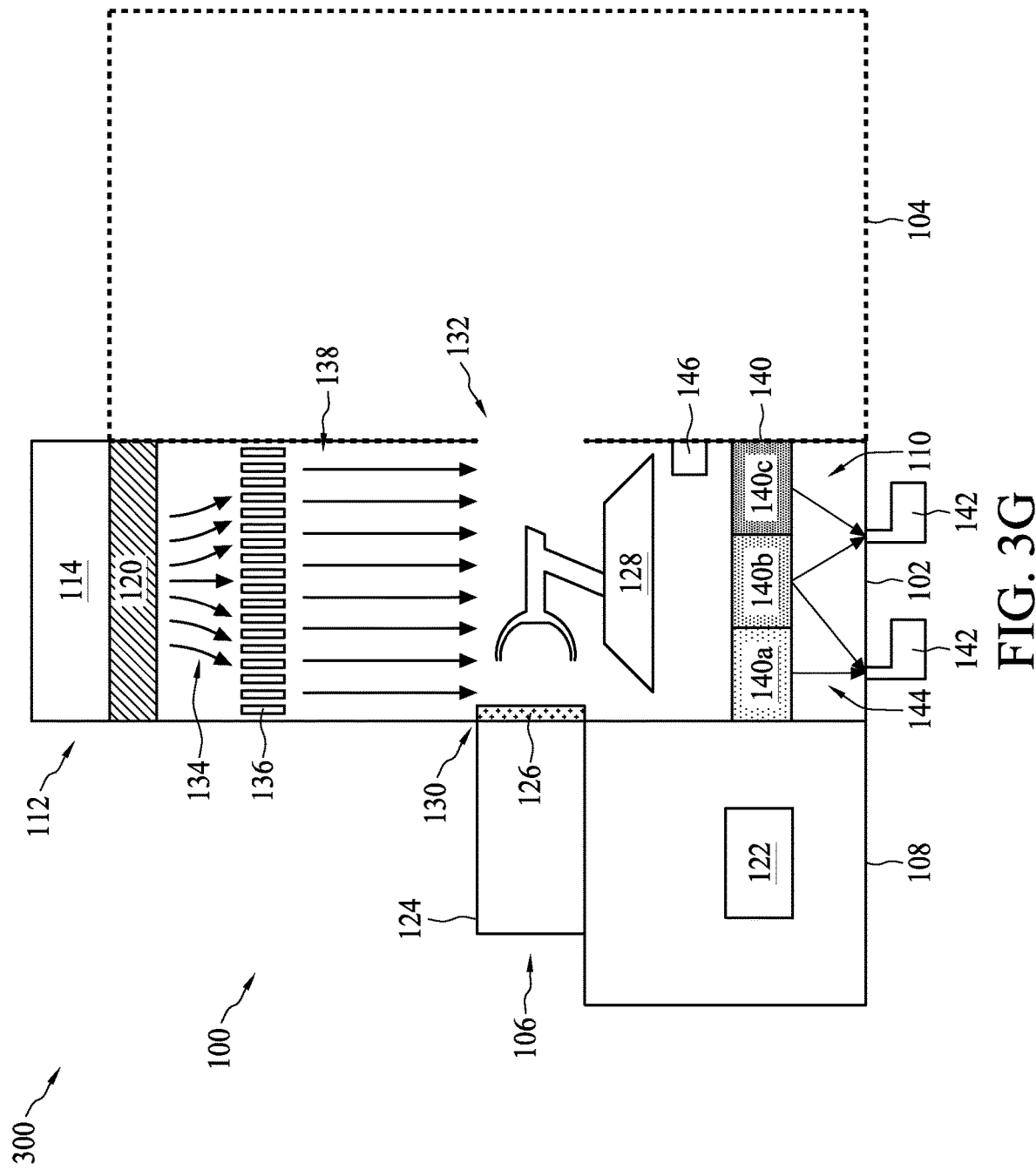

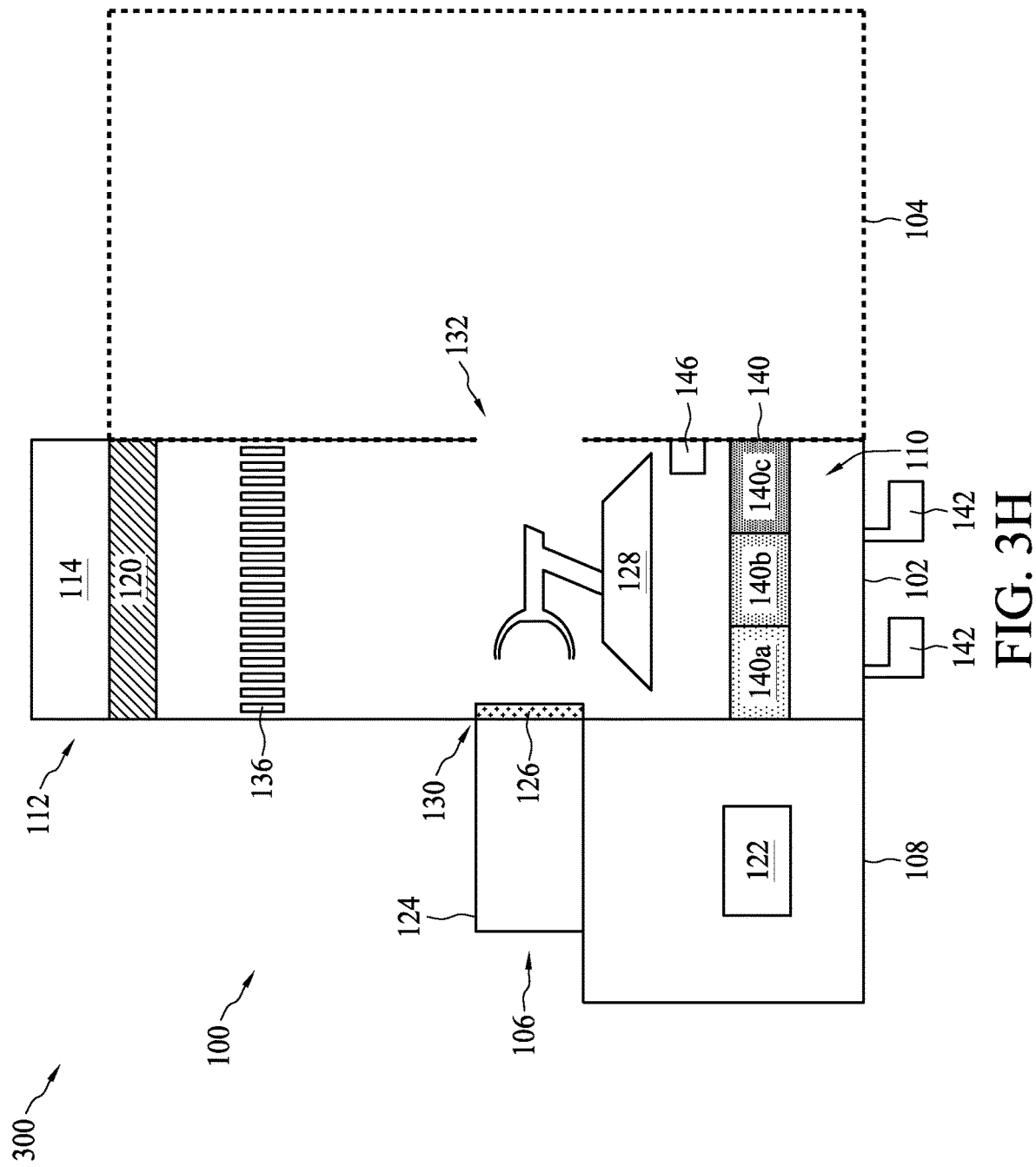

INTERFACE TOOL

BACKGROUND

A semiconductor wafer may be processed in various semiconductor processing tools in a semiconductor fabrication facility to produce various integrated circuits and/or semiconductor devices. A semiconductor wafer may be transported throughout the semiconductor fabrication facility and/or between the semiconductor processing tools in the semiconductor fabrication facility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2H are diagrams of an example implementation described herein.

FIGS. 3A-3H are diagrams of an example implementation described herein.

DETAILED DESCRIPTION

Figure 1A:
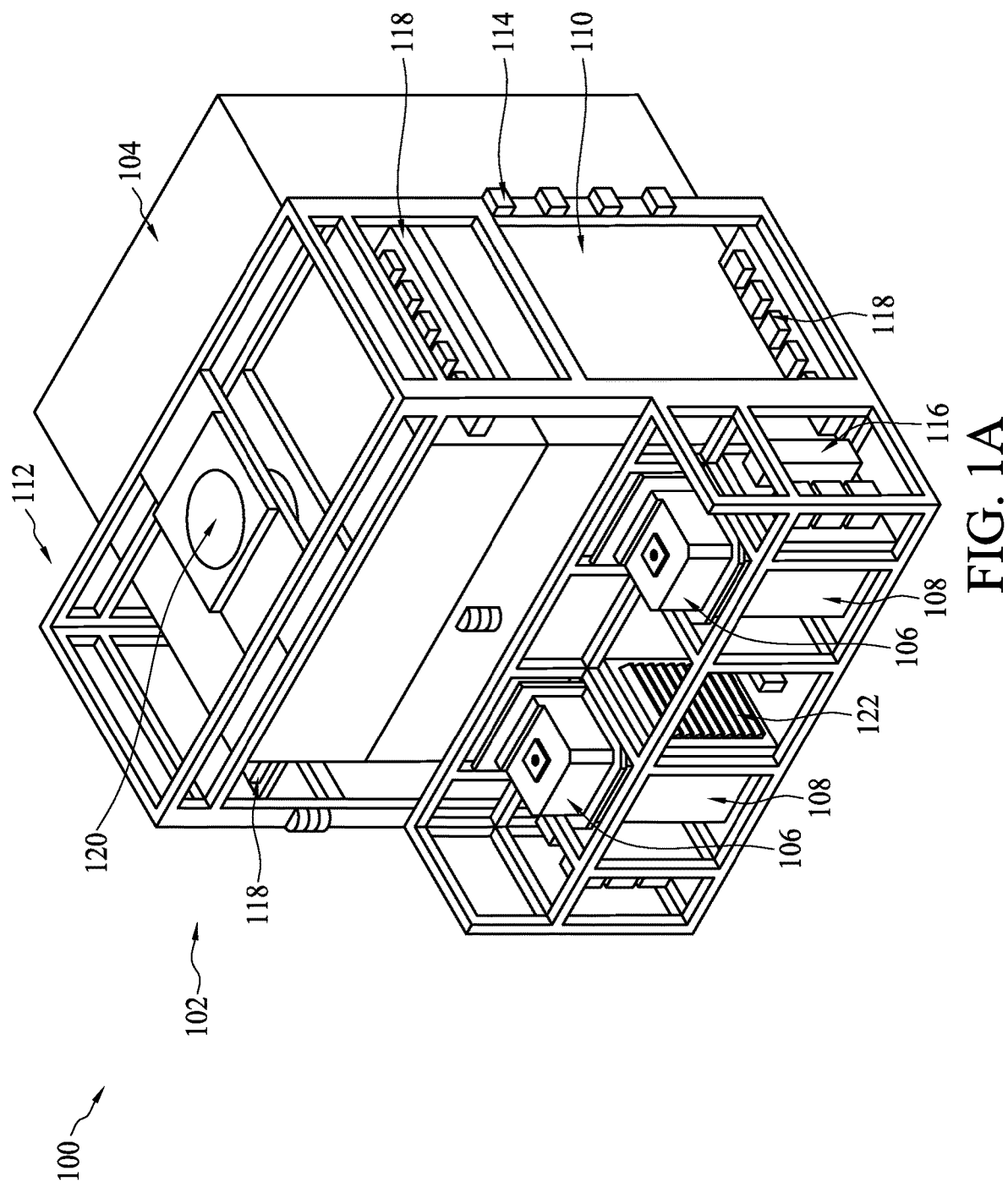
FIGS. 1A-1C are diagrams of an example semiconductor processing environment described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer transport tool (e.g., a robot arm) included in an interface tool (e.g., an equipment front-end module (EFEM) or similar type of interface tool) situated between a semiconductor processing tool and a load port may transfer semiconductor wafers between a transport carrier (e.g., a wafer cassette, a front-opening unified pod (FOUP), a pod, a container, or a similar type of device) and the semiconductor processing tool (e.g., an etch tool, a deposition tool). To transfer a semiconductor wafer from a transport carrier to a semiconductor processing tool, the transport carrier may be placed in and/or on a load port associated with the semiconductor processing tool. The wafer transport tool may obtain the semiconductor wafer from the transport carrier, and may transfer the semiconductor wafer to the semiconductor processing tool through a chamber of the interface tool. After processing, the wafer transport tool may return the semiconductor wafer to the transport tool through the chamber of the interface tool.

The environment within the chamber of the interface tool may be conditioned to minimize and/or prevent contamination of semiconductor wafers transferred through the chamber. For example, air may be provided to the chamber through a fan filter unit (FFU), which filters the air prior to blowing the air downward into the chamber. The air flowing downward through the chamber may collect contaminants in the chamber prior to reaching an extraction plenum so that the contaminants do not land on semiconductor wafers that are transferred through the chamber. However, the air flow provided by the FFU may be turbulent, which can interfere with the efficient removal of contaminants in the chamber. Turbulent air flow may slow or divert the air flow (and thus, the removal of contaminants) and/or may impart unintended vectors of travel to contaminants in the chamber. Moreover, the air provided to the chamber through the FFU may have a high relative humidity and/or a high oxygen content, which may cause oxidation and/or contamination of semiconductor wafers that are transferred through the chamber.

Some implementations described herein provide a closed gas circulation system. The closed gas circulation system includes various components and/or sub-systems to condition the air provided to a chamber of an interface tool. The closed gas circulation system may include a sealed plenum, circulation fans, and an FFU inlet to contain, filter, condition, and re-circulate a gas through the chamber. The gas provided to the chamber is maintained in a conditioned environment in the closed gas circulation system as opposed to introducing external air into the chamber through the FFU inlet. This enables precise control over the relative humidity and oxygen concentration of the gas used in the chamber, which reduces the oxidation of semiconductor wafers that are transferred through the chamber.

The closed gas circulation system may also include an air-flow rectifier, a return vent, and one or more vacuum pumps to form a downflow of collimated gas in the chamber and to automatically control the feed-forward pressure and flow of gas through the chamber and the sealed plenum. The downflow of collimated gas in the chamber may reduce turbulence within the chamber and may increase the contamination collecting efficiency of the gas circulated through the chamber.

Accordingly, the closed gas circulation system may reduce relative humidity and oxygen concentration in the chamber and may reduce semiconductor wafer contamination, which may reduce semiconductor wafer defects, may increase wafer acceptance test (WAT) yield, and may increase semiconductor device manufacturing yield. Moreover, the closed gas circulation system may include a controller and one or more sensors to collect sensor data and to automate one or more operating aspects of the closed gas circulation system, which may increase operating efficiency of the closed gas circulation system (and the interface tool), may reduce down-time of the interface tool, and may increase productivity of the interface tool.

Figure 1B:
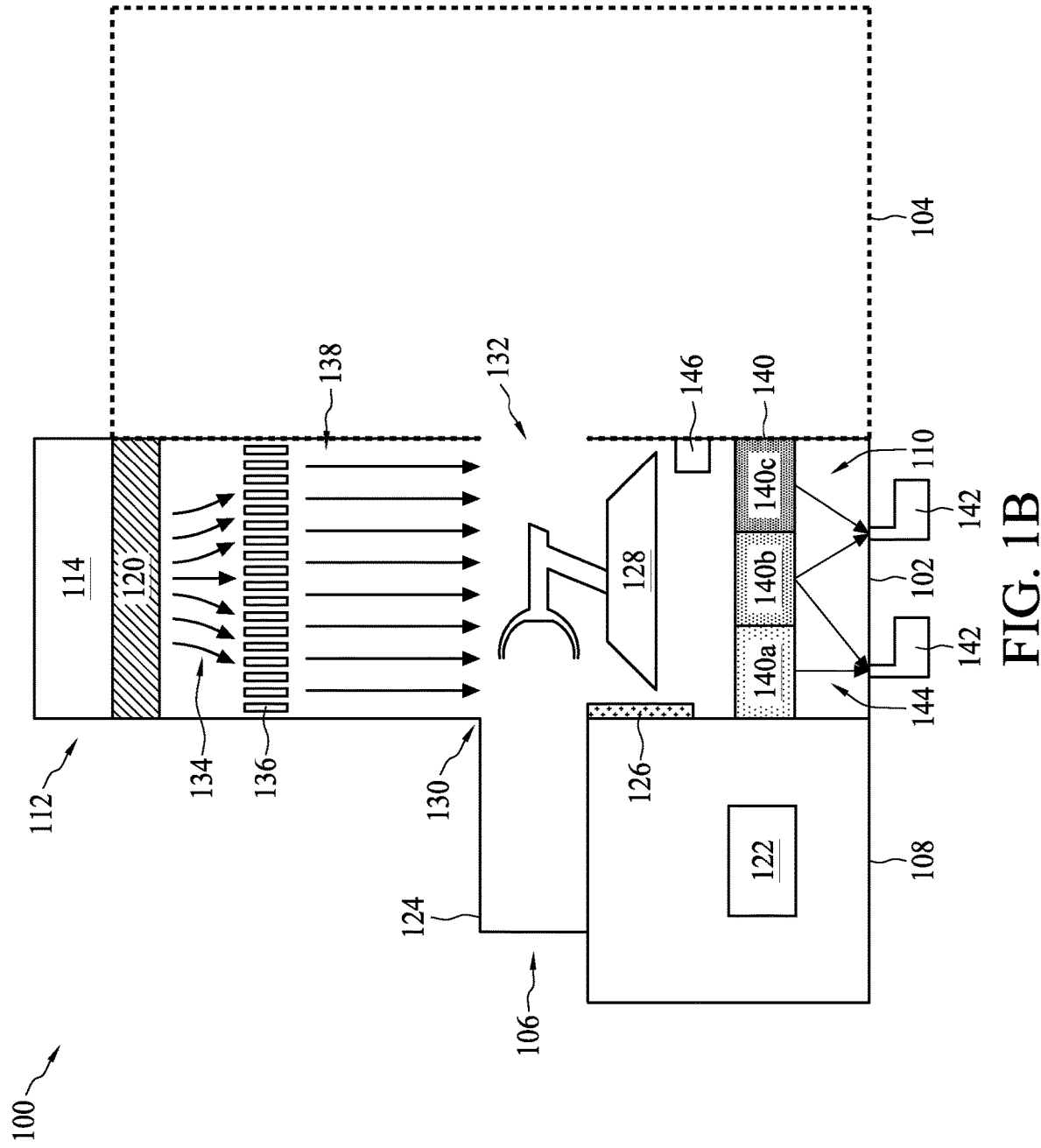
Figure 1C:
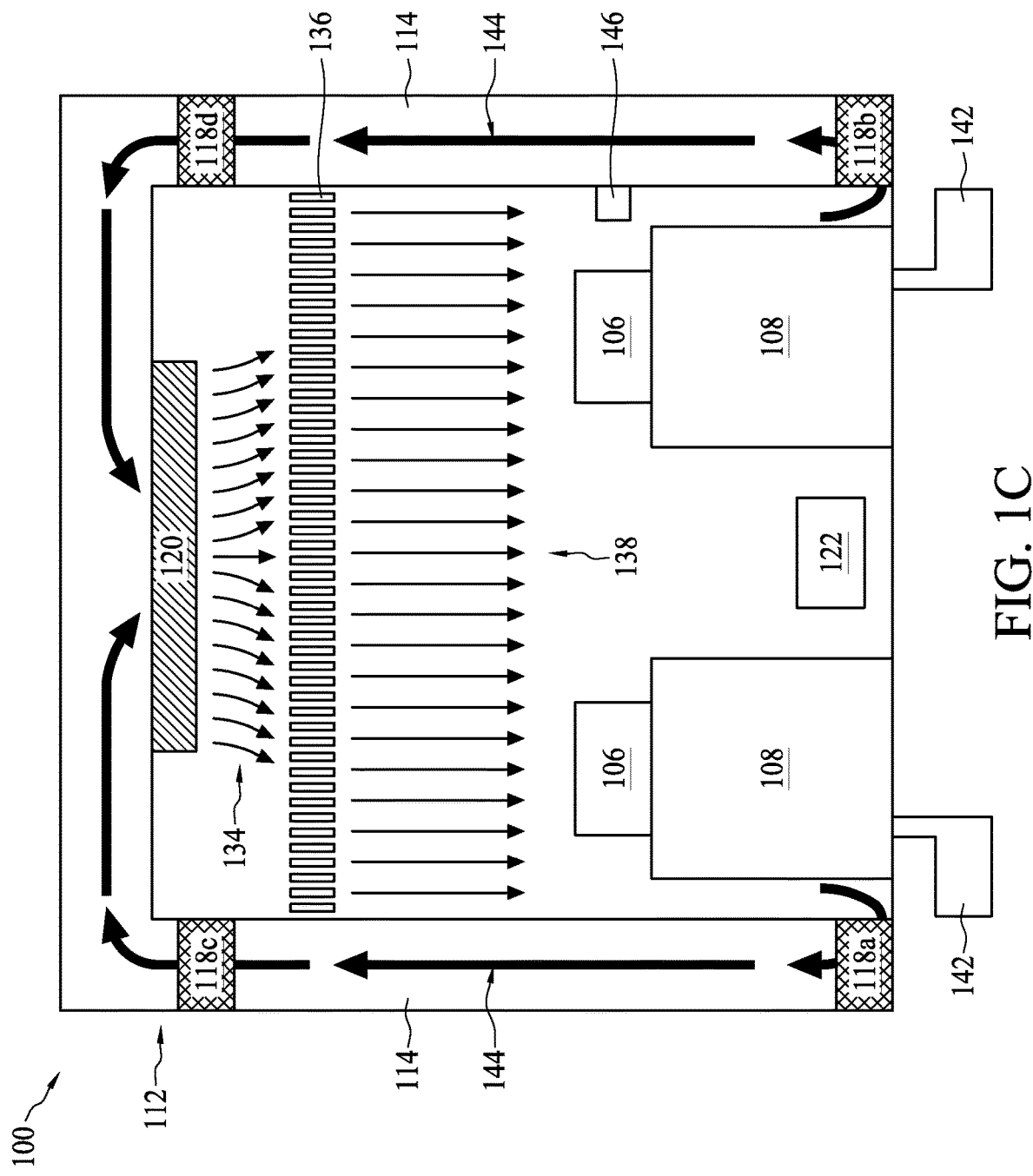

FIGS. 1A-1C are diagrams of an example semiconductor processing environment 100 described herein. The example semiconductor processing environment 100 may include, or may be included in, a semiconductor fabrication facility, a semiconductor foundry, a semiconductor processing facility, a semiconductor clean room, and/or another environment in which semiconductor wafers and/or devices are processed.

FIG. 1A illustrates a perspective view of the example semiconductor processing environment 100. As shown in FIG. 1A, the example semiconductor processing environment 100 may include an interface tool 102 configured to transfer semiconductor wafers between a semiconductor processing tool 104 and one or more transport carriers 106 supported on one or more load ports 108, among other tools and/or devices. The semiconductor processing tool 104 may include one or more tools configured to perform one or more semiconductor processing operations on one or more semiconductor wafers and/or devices. For example, the semiconductor processing tool 104 may include a deposition tool (e.g., a semiconductor processing tool configured to deposit one or more layers onto a semiconductor wafer), a plating tool (e.g., an electroplating tool configured to deposit one or more metal layers onto a semiconductor wafer), an exposure tool (e.g., an extreme ultraviolet (EUV) tool, an electron beam (e-beam) tool), an etch tool (e.g., a wet etch tool, a dry etch tool), or another type of semiconductor processing tool.

Each load port 108 may include a platform that is configured to receive and support a transport carrier 106. A transport carrier 106 may include a wafer cassette, a FOUP, a pod, a container, or a similar type of device configured to hold and/or store a plurality of semiconductor wafers. A load port 108 may receive a transport carrier 106 from a transport robot, a transport cart, an overhead hoist transport (OHT), or another device configured to move transport carriers to and from various locations in the example semiconductor processing environment 100.

A semiconductor wafer in a transport carrier 106 on a load port 108 may be transferred to the semiconductor processing tool 104 through a chamber 110 of the interface tool 102. The semiconductor wafer may be transferred directly into a processing area of the semiconductor processing tool 104, may be transferred to a staging area of the semiconductor processing tool 104, or may be transferred to another area of the semiconductor processing tool. Additionally and/or alternatively, a semiconductor wafer may be transferred from the semiconductor processing tool 104 to a transport carrier 106 on a load port 108 through the chamber 110. The chamber 110 may include a sealed enclosure that provides a conditioned space (e.g., temperature conditioned, humidity conditioned) through which semiconductor wafers may be transferred. The chamber 110 may be sealed to prevent the ingress of humidity, oxygen, and contaminants (e.g., dust and other particles) from the open area of the example semiconductor processing environment 100 external to the chamber 110.

The interface tool 102 may include a closed gas circulation system 112 configured to circulate a gas through the chamber 110 to condition the space in the chamber 110 and to remove contaminants from the chamber 110. The closed gas circulation system 112 may be a closed system in that the gas provided to the chamber 110 is enclosed and maintained in a sealed plenum 114 external to the chamber 110 and around the chamber 110, and is not mixed with external air in the open environment of the example semiconductor processing environment 100. In other words, the gas is removed from the chamber 110, circulated through the sealed plenum 114, and reintroduced back into the chamber 110 from the sealed plenum 114 without exposing the gas to external air. This allows precise control of various parameters of the gas and the chamber 110, such as precise relative humidity control of the gas and the chamber 110, precise oxygen concentration control of the gas and the chamber 110, and/or precise contaminant control of the gas and the chamber 110.

The sealed plenum 114 may be formed of a gas-impermeable material and/or gas-impermeable components, such as a plastic material and/or plastic components, a silicone material and/or silicone components, a metal material and/or metal components, a rubber material and/or rubber components, and/or a combination thereof. In some implementations, the sealed plenum 114 includes elongated panels, edge and corner supports, gaskets, caulking, and/or other components. In some implementations, the sealed plenum 114 includes a one-piece component. In some implementations, the sealed plenum 114 fully encloses the chamber 110 above a floor on which the interface tool 102 is located. In these examples, the gas is permitted to flow through the sealed plenum 114 along all four sides and the top of the outer surface of the chamber 110. In some implementations, the sealed plenum 114 encloses a subset of the sides (e.g., two of the sides) and the top of the chamber 110. In these examples, the gas is permitted to flow through the sealed plenum 114 along the subset of sides and the top of the outer surface of the chamber 110.

The gas may be introduced into the closed gas circulation system 112 and purged from the closed gas circulation system 112 through a gas panel 116. Purging the gas and introducing the gas are a subset of techniques that may be used to control the relative humidity and oxygen concentration in the chamber 110. The gas may include a dry air gas, an extreme clean dry air (XCDA) gas, a nitrogen ($N_2$) gas, a nitrogen-based gas, or another type of inert gas that resists chemically reacting with the materials used in semiconductor wafer processing.

A plurality of circulation fans 118 (or blowers) may be included in various locations of the sealed plenum 114 to draw gas from the chamber 110 into the sealed plenum 114, to circulate gas through the sealed plenum 114, and to provide gas to the chamber 110 through an FFU inlet 120 at the top of the chamber 110. The FFU inlet 120 may include a fan or blower and a filter (e.g., a high-efficiency particulate air (HEPA) filter or another type of air filter) configured to filter the incoming gas of particles and other contaminants prior to introduction into the chamber 110.

The closed gas circulation system 112 may include a controller 122 and one or more sensors to generate and collect sensor data associated with various operating parameters of the chamber 110, the closed gas circulation system 112, and/or the gas circulated through the chamber 110 and the closed gas circulation system 112. The controller 122 may further automatically control various aspects of the closed gas circulation system 112 based on the sensor data and/or one or more other types of data, such as initiating operation of the closed gas circulation system 112, terminating operation of the closed gas circulation system 112, purging gas from the closed gas circulation system 112, introducing gas into the closed gas circulation system 112, and/or one or more other operating parameters.

FIG. 1B illustrates an elevation view of a cross-section along a side of the example semiconductor processing environment 100. As shown in FIG. 1B, a transport carrier 106 supported on a load port 108 may include a housing 124 and a door 126. The housing 124 may be configured to store a plurality of semiconductor wafers therein and/or may be configured to be grasped and moved by a transport robot or OHT. The door 126 may be configured to be installed onto the housing 124 to form an air-tight seal between the housing 124 and the door 126 to minimize and/or prevent exposure of the semiconductor wafers therein to humidity, oxygen, and other contaminants.

The door 126 may be removed from the housing 124 to provide access to the housing 124. This permits a wafer transport tool 128, included in the chamber 110 of the interface tool 102, to access semiconductor wafers stored in the transport carrier 106, to place semiconductor wafers into the transport carrier 106, and/or to transport semiconductor wafers between the transport carrier 106 and the semiconductor processing tool 104. The wafer transport tool 128 may transport a semiconductor wafer between the transport carrier 106 and the semiconductor processing tool 104 through the chamber 110 to provide a conditioned and filtered environment in which the semiconductor wafers are transferred. The wafer transport tool 128 may access the transport carrier 106 through an opening 130 in a side of the chamber 110 and may access the semiconductor processing tool 104 through an opening 132 in another side of the chamber 110. In some implementations, the opening 130 and the opening 132 are on the same side of the chamber 110. In some implementations, the opening 130 and the opening 132 are on opposing sides of the chamber 110 or adjacent sides of the chamber 110. In some implementations, the chamber 110 may include one or more doors to form an air-tight seal around the opening 130 and/or the opening 132 (e.g., when a transport carrier 106 is not inserted into the opening 130).

FIG. 1B further illustrates an example flow of gas through the chamber 110. As shown in FIG. 1B, gas may be provided into the chamber 110 from the sealed plenum 114 and through the FFU inlet 120. A supply flow 134 of gas may flow downward in the chamber from the FFU inlet 120 to an air-flow rectifier 136 included in the chamber 110 above the wafer transport tool 128. The closed gas circulation system 112 may include the air-flow rectifier 136 to rectify the supply flow 134 of the gas in the chamber 110. In particular, the air-flow rectifier 136 may be configured to collimate the supply flow 134 of the gas to form a laminar flow 138 of the gas downward into the chamber 110. The laminar flow 138 may include collimated or parallel flow paths of the gas downward in the chamber 110. The laminar flow 138 reduces, minimizes, and/or prevents mixing of the flow paths of the gas, which reduces, minimizes, and/or prevents turbulence in the chamber 110.

The air-flow rectifier 136 may be formed of various types of materials, such as a plastic, a metal, a composite, or a combination thereof. In some implementations, the air-flow rectifier 136 is formed of polyethylene or polyvinyl chloride (PVC). The air-flow rectifier 136 may span the entire horizontal cross-sectional area of the chamber 110 to minimize and/or prevent air-flow leakage around the air-flow rectifier 136. In this way, all of the gas provided to the chamber 110 through the FFU inlet 120 flows through the air-flow rectifier 136.

To collimate the supply flow 134 of gas to form the laminar flow 138, the air-flow rectifier 136 may include a porous structure including a plurality of apertures (e.g., holes, openings) through the entire thickness of the air-flow rectifier 136. The air-flow rectifier 136 may include hundreds or thousands of apertures, for example, through which gas may flow. The apertures partition the supply flow 134 of gas into separate flow paths that make up the laminar flow 138. The size of the apertures (e.g., the width or diameter) may be in a range of 0.01 micron to 1 micron so as to not be too small and restrict the flow of gas through the apertures and so as to not be too large to collimate the gas. The apertures may be evenly and/or unevenly spaced across the air-flow rectifier 136 in a manner to produce the laminar flow 138.

As shown in FIG. 1B, the laminar flow 138 of gas may flow downward in the chamber 110 over the wafer transport tool 128. The laminar flow 138 of gas may flow downward through a return vent 140 below the wafer transport tool 128. The closed gas circulation system 112 may include one or more vacuum pumps 142 to cause the laminar flow 138 of the gas to flow downward in the chamber 110 through the return vent 140. In particular, the one or more vacuum pumps 142 may be located near the bottom of the chamber 110 (e.g., outside of the chamber 110) or below the chamber 110 (e.g., under the floor on which the interface tool 102 is located), and may generate a negative pressure differential between the top of the chamber 110 and the bottom of the chamber 110. The negative pressure differential between the top of the chamber 110 and the bottom of the chamber 110 forces the gas to flow downward in the chamber 110 through the return vent 140. The negative pressure differential may be in a range of approximately −0.01 Pascals to approximately −10 Pascals to facilitate the removal of particles and other contaminants in the chamber 110 and to minimize turbulence in the chamber 110.

The gas that flows through the return vent 140 may be collected and provided back to the sealed plenum 114 as a return flow 144 of the gas. The gas may be recirculated through the closed gas circulation system 112 and the chamber 110 in a continuous manner, in a manner similar to that described above, to remove contaminants from the chamber 110 and to control relative humidity and oxygen concentration (among other environmental parameters) in the chamber 110.

The return vent 140 may include a porous structure. The porous structure may include a plurality of apertures through the entire thickness of the return vent 140 through which the gas may flow. The size (e.g., the width or diameter) of the apertures of the return vent 140 may be in a range of approximately 1 centimeter to approximately 10 centimeters. In some implementations, the size of the apertures is based on one or more parameters such as the size of the chamber 110 (e.g., larger apertures may be included for larger chambers and smaller apertures may be included for smaller chambers), a configured flow rate (or flow rate range) of gas through the chamber 110 (e.g., larger apertures may be included for higher flow rates and smaller apertures may be included for smaller flow rates), a configured negative pressure differential (or negative pressure differential range) for the chamber 110 (e.g., larger apertures may be included for smaller negative pressure differentials and smaller apertures may be included for larger negative pressure differentials), and/or one or more other parameters.

The return vent 140 may further include a plurality of zones, where each zone (or subsets of zones) may include a respective plurality of apertures. Each of the respective pluralities of apertures may include a different aperture size. The zones may be configured such that the size of apertures increases (or decreases) across the zones from one side of the chamber 110 to another side of the chamber 110 or from a first area of the chamber 110 to a second area of the chamber 110. This may form a gradient of aperture sizes across the return vent 140, which may facilitate the laminar flow 138 of gas toward an inlet into the sealed plenum 114. As an example, a first zone 140a may include apertures having a size of 1 centimeter, a second zone 140b may include apertures having a size of 5 centimeters, and a third zone 140c may include apertures having a size of 10 centimeters.

As further shown in FIG. 1B, the closed gas circulation system 112 may include one or more sensors 146 configured to generate and provide sensor data associated with various operating parameters of the chamber 110, the closed gas circulation system 112, and/or the gas circulated through the chamber 110 and the closed gas circulation system 112 to the controller 122. While FIG. 1B illustrates the one or more sensor 146 being included in the chamber 110, the one or more sensors 146 may be additionally and/or alternatively included in other locations such as in the sealed plenum 114, on the one or more vacuum pumps 142, and/or at or on one or more other locations. The controller 122 may receive the sensor data and may control various components included in the closed gas circulation system 112 and/or the interface tool 102.

The one or more sensors 146 may include a pressure sensor configured to generate pressure sensor data (e.g., data that may indicate or that may be used to determine a pressure or pressure differential in the chamber 110 and/or in the sealed plenum 114), a relative humidity sensor configured to generate relative humidity data (e.g., data that may indicate or that may be used to determine a relative humidity percentage in the chamber 110 and/or in the sealed plenum 114), an oxygen sensor configured to generate oxygen concentration data (e.g., data that may indicate or that may be used to determine an oxygen concentration in the chamber 110 and/or in the sealed plenum 114), a flow rate meter configured to generate flow rate data (e.g., data that may indicate or that may be used to determine a volumetric rate of gas flowing through the chamber 110 and/or through the sealed plenum 114), an anemometer configured to generate flow speed data (e.g., data that may indicate or that may be used to determine a linear air speed of the gas flowing through the chamber 110 and/or through the sealed plenum 114), a proximity sensor or another type of sensor that is configured to generate position data for the door 126 (e.g., that may be used to determine whether the door 126 is open or closed), another type of sensor, or a combination thereof.

In some implementations, the controller 122 automatically initiates operation of the closed gas circulation system 112 based on the position data for the door 126 received from the one or more sensors 146 (e.g., based on determining that the door 126 has been opened or removed from the transport carrier 106), which may include activating the one or more circulation fans 118, activating the one or more vacuum pumps 142, and/or activating the fan of the FFU inlet 120. In some implementations, the controller 122 automatically ceases operation of the closed gas circulation system 112 based on the position data for the door 126 received from the one or more sensors 146 (e.g., based on determining that the door 126 has been closed or placed onto the transport carrier 106), which may include deactivating the one or more circulation fans 118, deactivating the one or more vacuum pumps 142, and/or deactivating the fan of the FFU inlet 120.

In some implementations, the controller 122 may automatically adjust the negative pressure differential in the chamber 110 based on pressure sensor data, flow rate data, relative humidity data, oxygen concentration data, and/or flow speed data, which may include adjusting (or causing the one or more vacuum pumps 142 to adjust) a butterfly damper position of the one or more vacuum pumps 142 to increase or decrease the negative pressure differential. In some implementations, the controller 122 adjusts the negative pressure differential based on determining that the negative pressure differential is not within a configured negative pressure differential range for the closed gas circulation system 112 or based on determining that the negative pressure differential is not within a configured tolerance for a negative pressure differential setting for the closed gas circulation system 112.

In some implementations, the controller 122 adjusts the negative pressure differential based on determining that the flow rate is not within a configured flow rate range for the closed gas circulation system 112 or based on determining that the flow rate is not within a configured tolerance for a flow rate setting for the closed gas circulation system 112. In some implementations, the controller 122 adjusts the negative pressure differential based on determining that the flow speed is not within a configured flow speed range for the closed gas circulation system 112 or based on determining that the flow speed is not within a configured tolerance for a flow speed setting for the closed gas circulation system 112. The flow speed range may be from approximately 0.1 meters per second (e.g., to provide sufficient flow speed for the gas to remove contaminants from the chamber 110) to approximately 1 meter per second (e.g., to minimize turbulence of the gas flowing through the chamber 110).

In some implementations, the controller 122 adjusts the negative pressure differential, the flow rate, and/or the gas flow speed to control the feed-forward airflow of the gas through the closed gas circulation system 112 (e.g., the flow of the gas through the full cycle of the closed gas circulation system 112, including through the FFU inlet 120, through the chamber 110, and through the sealed plenum 114). The controller 122 may control the feed-forward airflow (e.g., by adjusting the negative pressure differential) to adjust the relative humidity (e.g., based on determining that the relative humidity does not satisfy a relative humidity threshold for the gas) and/or to reduce the oxygen concentration (e.g., based on determining that the oxygen concentration does not satisfy an oxygen concentration threshold for the gas). As an example, the controller 122 may reduce the relative humidity in the chamber 110 to less than approximately 43% and, in some cases, less than approximately 1% to minimize the formation of condensation on semiconductor wafers transferred through the chamber 110. As another example, the controller 122 may reduce the oxygen concentration in the chamber 110 to below $2.1 \times 10^5$ parts per million and/or below $1 \times 10^3$ parts per million to minimize the oxidation of semiconductor wafers transferred through the chamber 110.

In some implementations, the controller 122 adjusts the fan speed of one or more circulation fans 118 to provide an even flow of gas through the sealed plenum 114, to adjust the feed-forward airflow through the closed gas circulation system 112, to control the amount of gas supplied to the chamber 110 through the FFU inlet 120, and/or to control or adjust one or more other operating parameters. In some implementations, the controller 122 introduces gas into the closed gas circulation system 112 through a gas panel 116 and/or purges gas from closed gas circulation system 112 through a gas panel 116 to control or adjust the relative humidity in the chamber 110, to control or adjust the oxygen concentration in the chamber 110, and/or to increase or decrease the volume of gas flowing through the closed gas circulation system 112.

FIG. 1C illustrates an elevation view of a cross-section along a front of the example semiconductor processing environment 100. Moreover, FIG. 1C illustrates an example recirculation path of gas through the closed gas circulation system 112 and the chamber 110. As shown in FIG. 1C, the supply flow 134 of the gas may be provided from the sealed plenum 114 through the FFU inlet 120. The supply flow 134 of the gas flows through the air-flow rectifier 136, which collimates the gas to form the laminar flow 138 of the gas. The negative pressure differential in the chamber 110 formed by the one or more vacuum pumps 142 causes the laminar flow 138 of the gas to flow downward in the chamber 110. The gas is collected near the bottom of the chamber 110, and a return flow 144 of the gas is provided to the sealed plenum 114. Circulation fans 118a and 118b near the bottom of the sealed plenum 114 cause the return flow 144 of the gas to flow into the sealed plenum 114. A combination of the circulation fans 118a and 118b, and circulation fans 118c and 118d, cause the return flow 144 of the gas to flow upward along the sealed plenum 114. The return flow 144 of the gas is provided to the FFU inlet 120, which filters the gas and provides the supply flow 134 to the chamber 110. This recirculation of gas through the chamber 110 and the closed gas circulation system 112 may continue while the closed gas circulation system 112 is in operation.

As indicated above, FIGS. 1A-1C are provided as one or more examples. Other examples may differ from what is described with regard to FIGS. 1A-1C.

FIGS. 2A-2H are diagrams of an example implementation 200 described herein. Example implementation 200 may include an example operation of the closed gas circulation system 112 in connection with transferring a semiconductor wafer from the transport carrier 106 to the semiconductor processing tool 104.

Figure 2A:
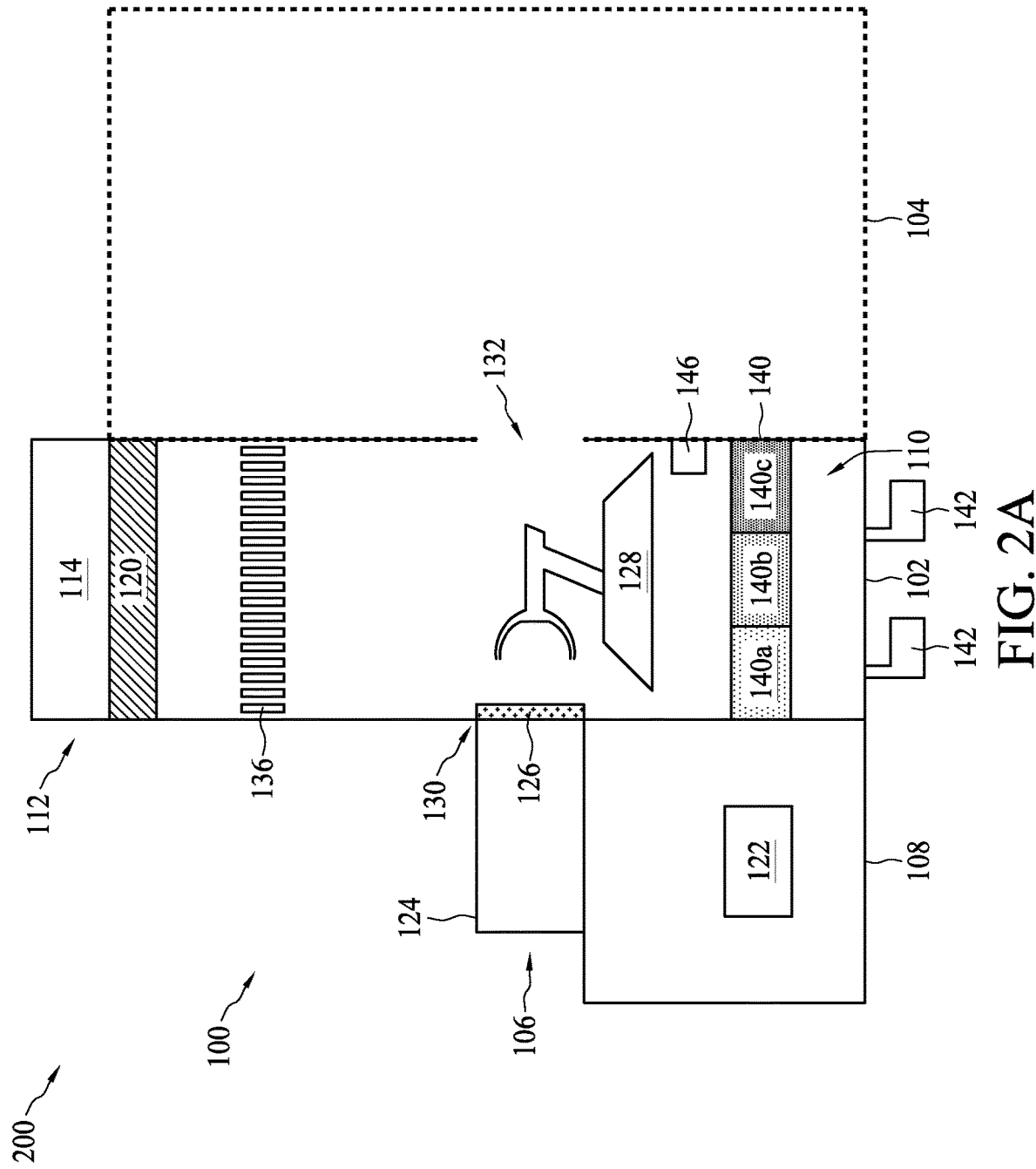

As shown in FIG. 2A, the transport carrier 106 may be placed on the load port 108. The door 126 of the transport carrier 106 may be installed on the housing 124 of the transport carrier 106 to prevent exposure of the semiconductor wafers therein to humidity, oxygen, and/or contaminants in the external environment.

As shown in FIG. 2B, the door 126 may be removed from the housing 124 of the transport carrier 106 to provide access to the semiconductor wafers therein. The controller 122 may determine that the door 126 has been opened and removed from the housing 124. For example, the controller 122 may determine that the door 126 has been opened and removed from the housing 124 based on sensor data (e.g., proximity sensor data), associated with the position of the door 126, received from the one or more sensors 146.

Figure 2C:
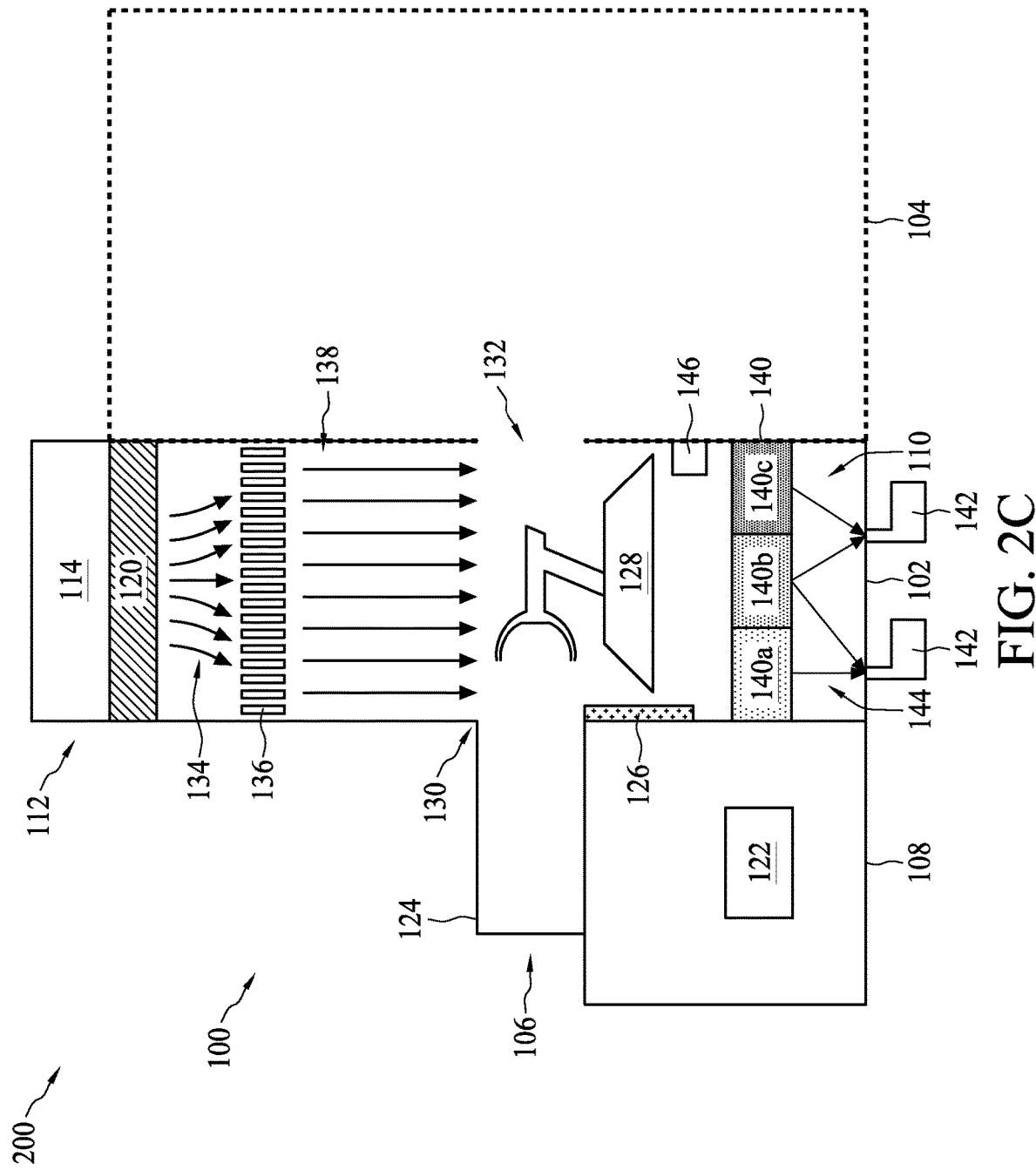

As shown in FIG. 2C, the controller 122 may automatically initiate operation of the closed gas circulation system 112 based on determining that the door 126 has been removed from the housing 124. For example, the controller 122 may automatically cause the closed gas circulation system 112 to provide the supply flow 134 of gas from the sealed plenum 114 to the chamber 110 through the FFU inlet 120. The supply flow 134 of the gas may flow through the air-flow rectifier 136, which may form the laminar flow 138 of the gas in the chamber 110 from the supply flow 134. The laminar flow 138 of the gas may flow downward in the chamber 110 over the wafer transport tool 128 and through the return vent 140. The gas flowing through the return vent 140 may be collected and provided to the sealed plenum 114 as a return flow 144 of the gas. The circulation fans 118 may circulate the return flow 144 through the sealed plenum 114 and to the FFU inlet 120. The FFU inlet 120 filters the gas, and the gas is recirculated through the chamber 110 and the closed gas circulation system 112 in a similar manner.

Figure 2D:
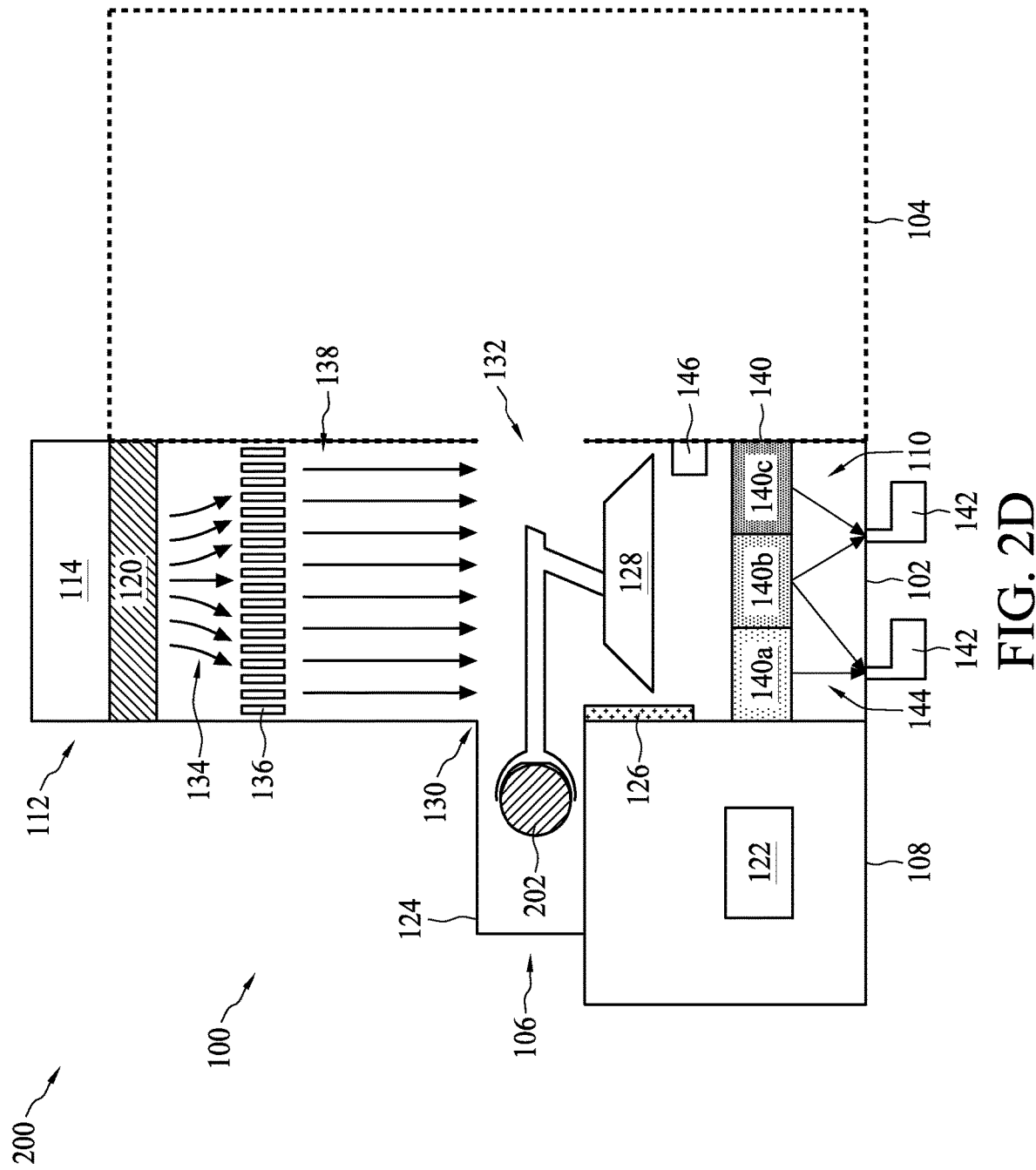
Figure 2E:
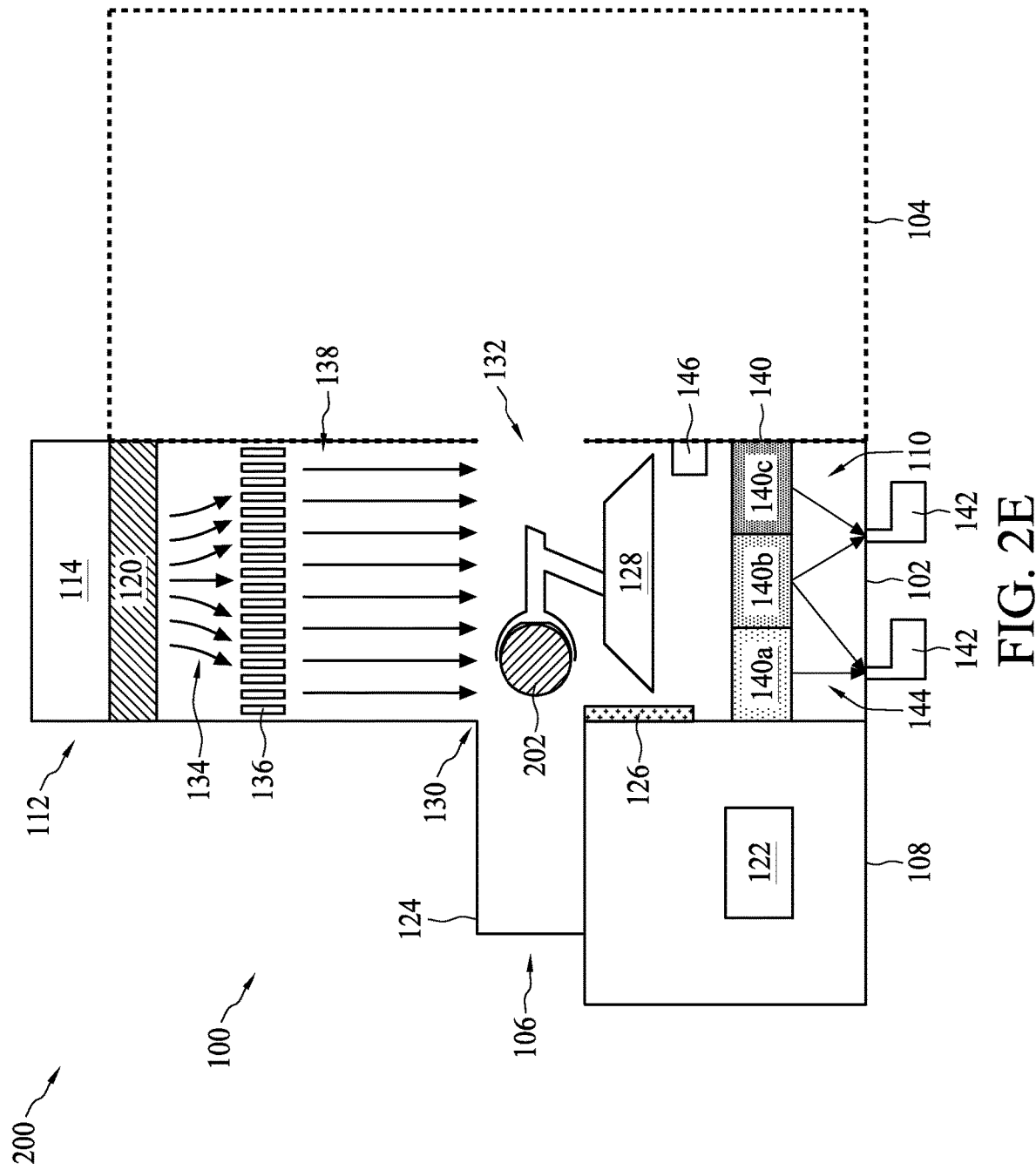
Figure 2F:
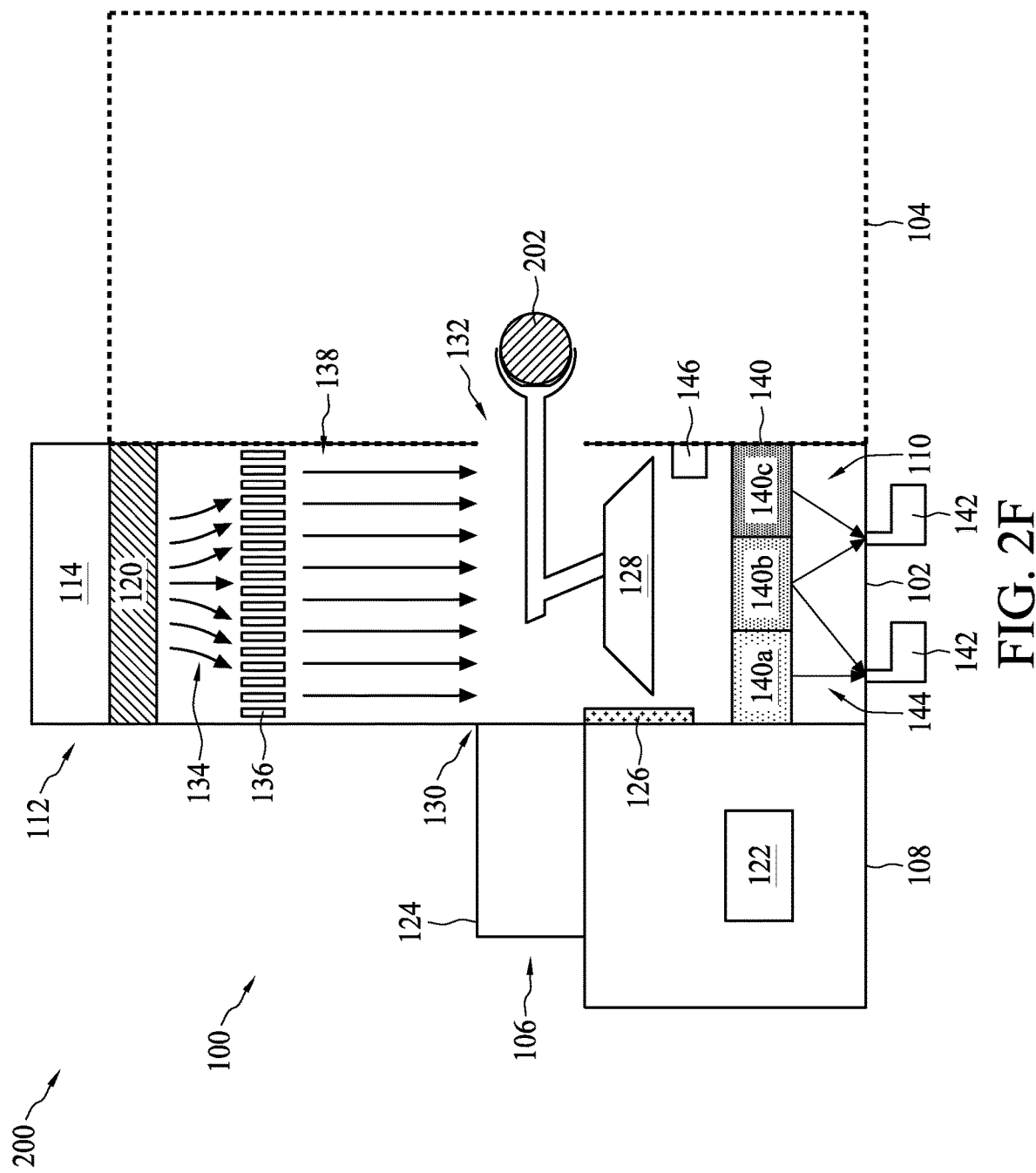

As shown in FIGS. 2D-2F, the wafer transport tool 128 may transfer a semiconductor wafer 202 from the transport carrier 106 to the semiconductor processing tool 104 while the closed gas circulation system 112 is in operation. The laminar flow 138 of the gas in the chamber 110 may be used to remove contaminants in the chamber 110 while the wafer transport tool 128 transfers the semiconductor wafer 202 from the transport carrier 106 to the semiconductor processing tool 104. In some implementations, the closed gas circulation system 112 may be operated for a time duration (e.g., approximately 12 minutes or longer) prior to the transfer of the semiconductor wafer 202 so that the closed gas circulation system 112 is permitted to achieve a steady state of operation. This permits the relative humidity and the oxygen concentration in the chamber 110 to be reduced to acceptable levels before the semiconductor wafer 202 is transferred.

As shown in FIG. 2D, the wafer transport tool 128 may obtain the semiconductor wafer 202 from the transport carrier 106 through the opening 130 in the chamber 110. As shown in FIG. 2E, the wafer transport tool 128 may retract the semiconductor wafer through the opening 130 and into the chamber 110. As shown in FIG. 2F, the wafer transport tool 128 may provide the semiconductor wafer 202 to the semiconductor processing tool 104 through the opening 132.

As shown in FIG. 2G, the door 126 of the transport carrier 106 may be placed back onto the housing 124 of the transport carrier 106 after the semiconductor wafer 202 has been transferred to the semiconductor processing tool 104. The controller 122 may determine that the door 126 has been closed and placed or installed back onto the housing 124. For example, the controller 122 may determine that the door 126 has been closed and placed or installed back onto the housing 124 based on sensor data (e.g., proximity sensor data), associated with the position of the door 126, received from the one or more sensors 146.

Figure 2H:
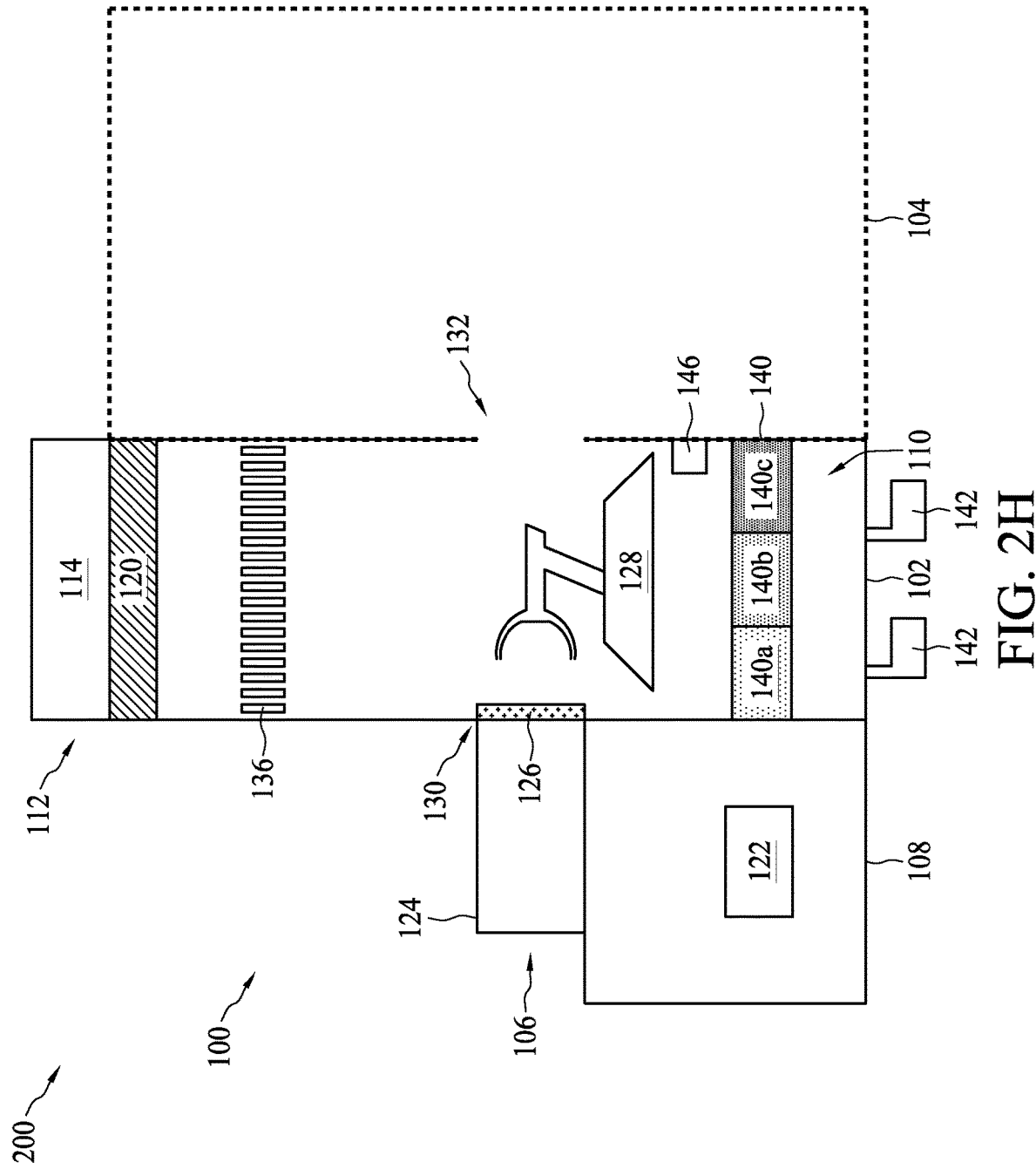

As shown in FIG. 2H, the controller 122 may automatically cease operation of the closed gas circulation system 112 based on determining that the door 126 has been closed and placed or installed back onto the housing 124. For example, the controller 122 may automatically cause the closed gas circulation system 112 to stop providing the supply flow 134 of gas from the sealed plenum 114 to the chamber 110 through the FFU inlet 120. The controller 122 may also deactivate one or more of the FFU inlet 120, the one or more vacuum pumps 142, and/or the circulation fans 118.

As indicated above, FIGS. 2A-2H are provided as an example. Other examples may differ from what is described with regard to FIGS. 2A-2H.

FIGS. 3A-3H are diagrams of an example implementation 300 described herein. Example implementation 300 may include an example operation of the closed gas circulation system 112 in connection with transferring a semiconductor wafer from the semiconductor processing tool 104 to the transport carrier 106.

Figure 3A:
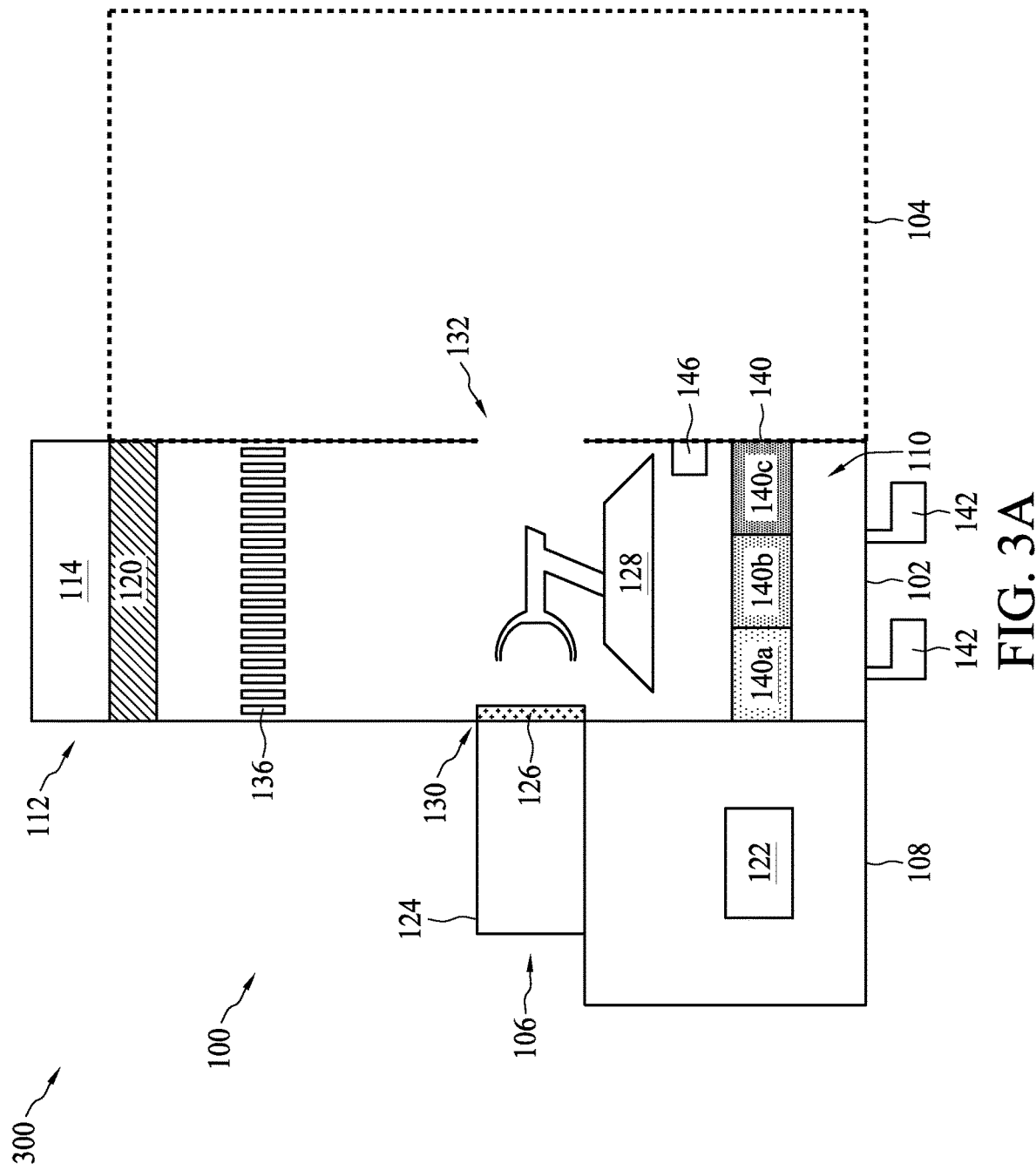

As shown in FIG. 3A, the transport carrier 106 may be placed on the load port 108. The door 126 of the transport carrier 106 may be installed on the housing 124 of the transport carrier 106 to prevent humidity, oxygen, and/or contaminant ingress into the transport carrier 106.

Figure 3B:
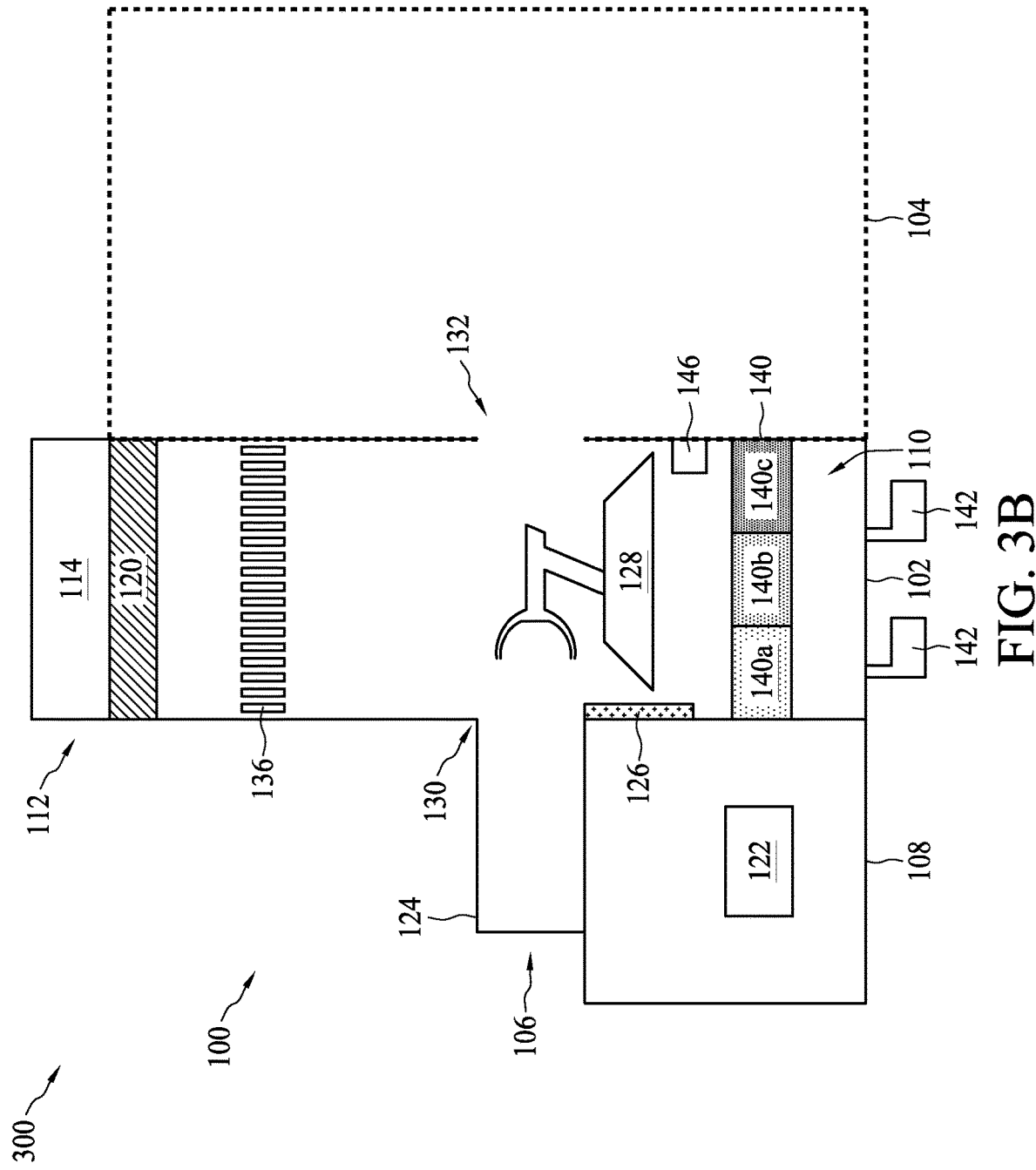

As shown in FIG. 3B, the door 126 may be opened and removed from the housing 124 of the transport carrier 106 to provide access to the housing 124. The controller 122 may determine that the door 126 has been opened and removed from the housing 124. For example, the controller 122 may determine that the door 126 has been opened and removed from the housing 124 based on sensor data (e.g., proximity sensor data), associated with the position of the door 126, received from the one or more sensors 146.

Figure 3C:
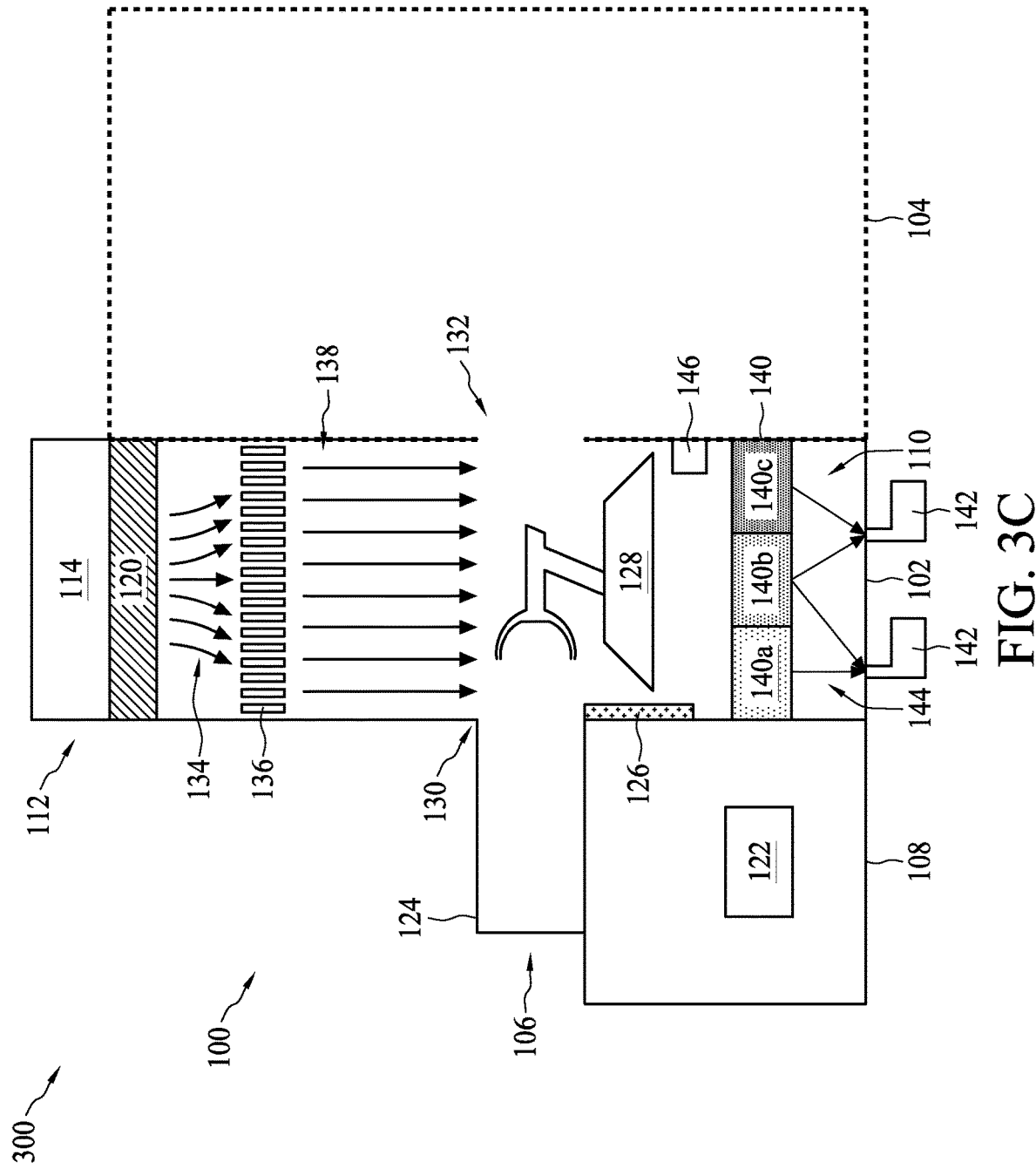

As shown in FIG. 3C, the controller 122 may automatically initiate operation of the closed gas circulation system 112 based on determining that the door 126 has been opened and removed from the housing 124. For example, the controller 122 may automatically cause the closed gas circulation system 112 to provide the supply flow 134 of gas from the sealed plenum 114 to the chamber 110 through the FFU inlet 120. The supply flow 134 of the gas may flow through the air-flow rectifier 136, which may form the laminar flow 138 of the gas in the chamber 110 from the supply flow 134. The laminar flow 138 of the gas may flow downward in the chamber 110 over the wafer transport tool 128 and through the return vent 140. The gas flowing through the return vent 140 may be collected and provided to the sealed plenum 114 as a return flow 144 of the gas. The circulation fans 118 may circulate the return flow 144 through the sealed plenum 114 and to the FFU inlet 120. The FFU inlet 120 filters the gas, and the gas is recirculated through the chamber 110 and the closed gas circulation system 112 in a similar manner.

Figure 3D:
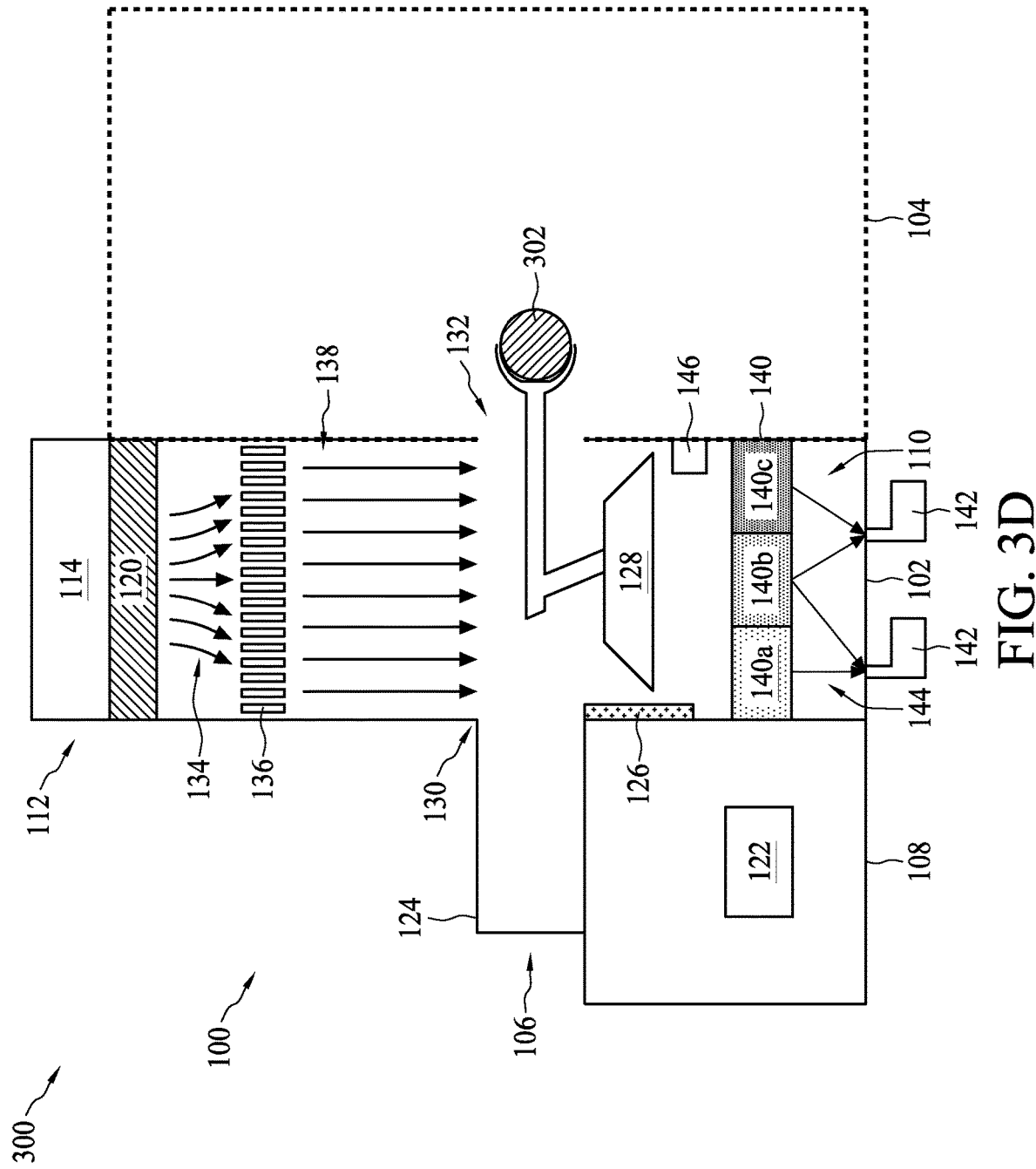
Figure 3E:
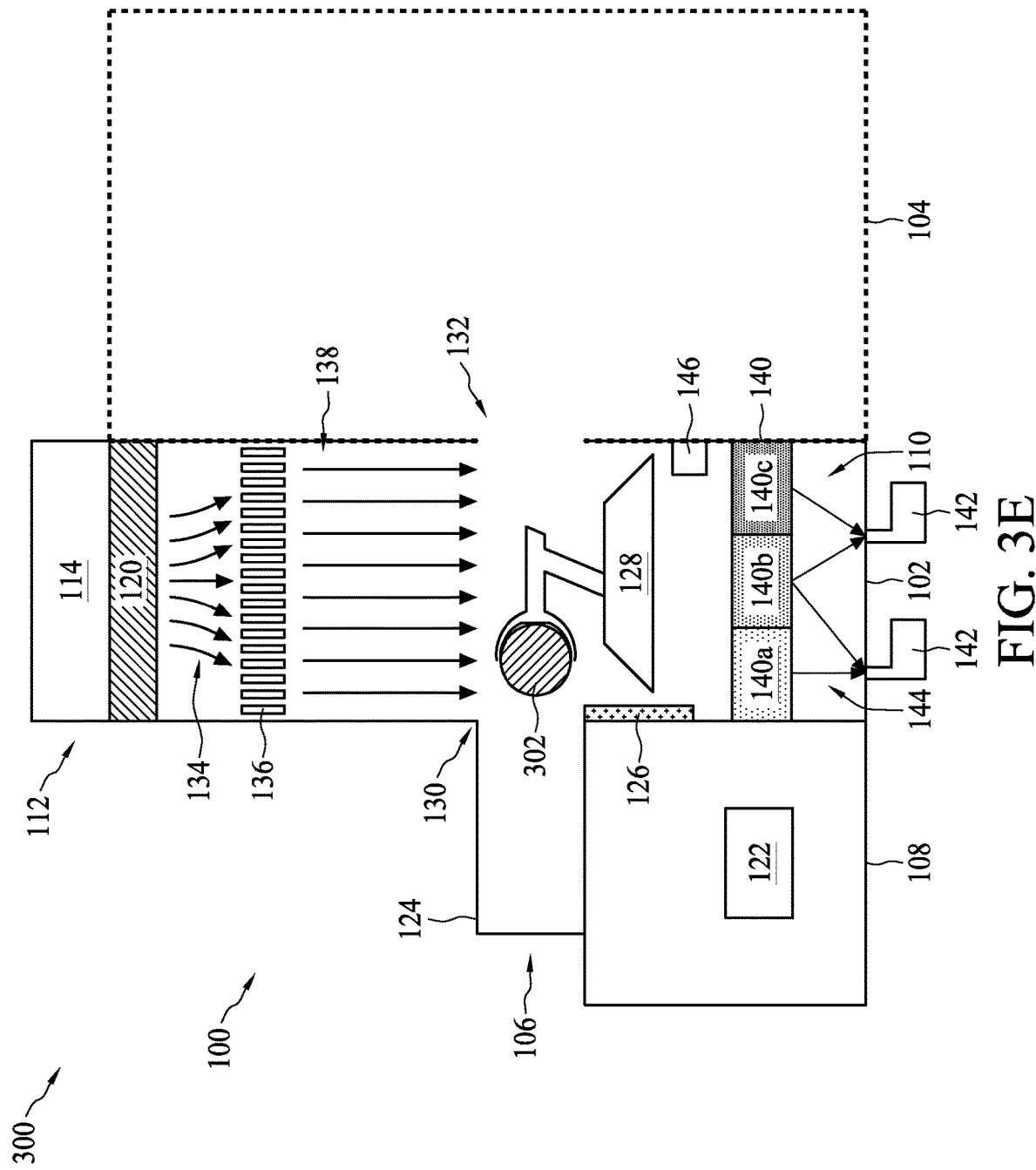
Figure 3F:
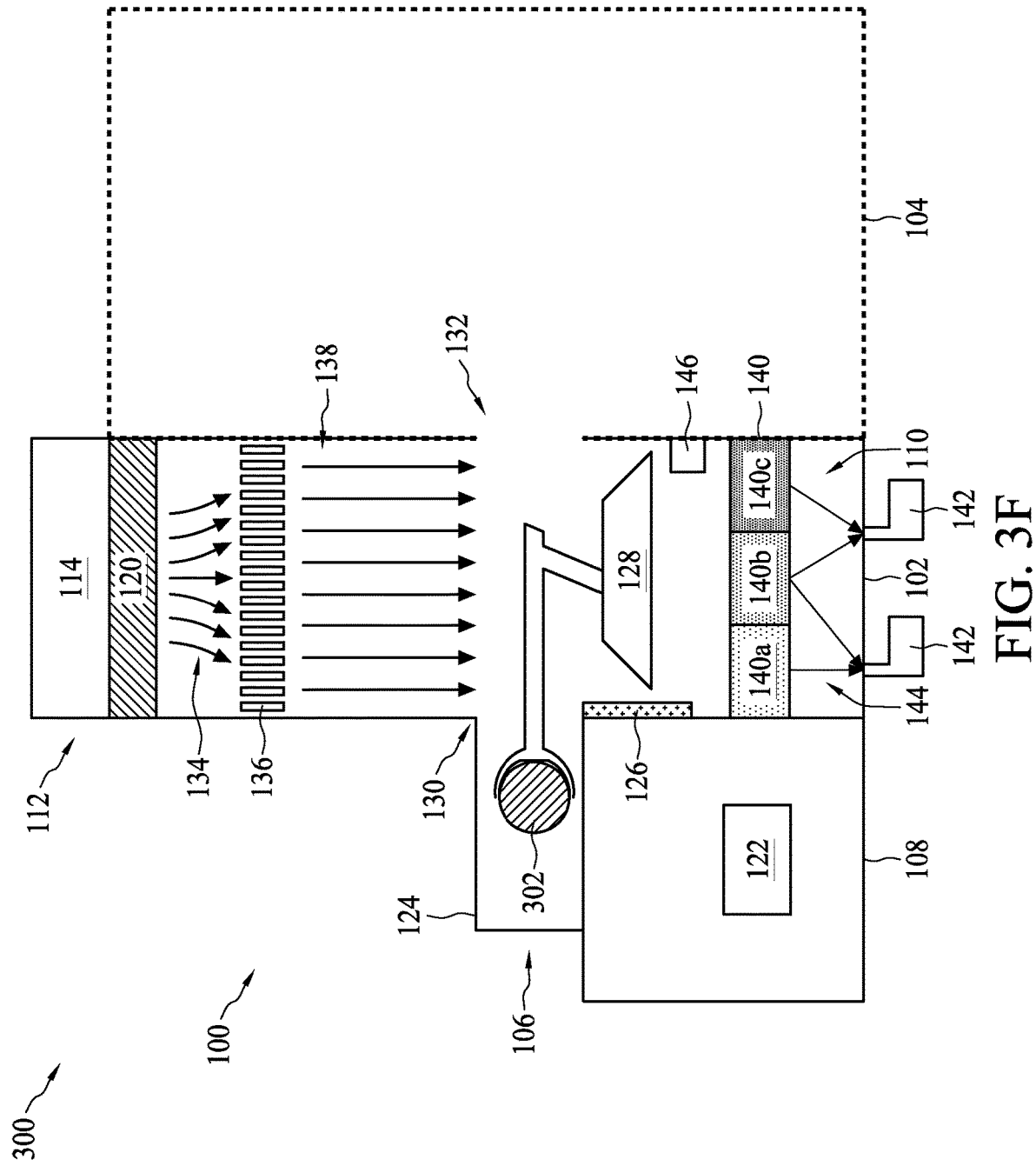

As shown in FIGS. 3D-3F, the wafer transport tool 128 may transfer a semiconductor wafer 302 from the semiconductor processing tool 104 to the transport carrier 106 while the closed gas circulation system 112 is in operation. The laminar flow 138 of the gas in the chamber 110 may be used to remove contaminants in the chamber 110 while the wafer transport tool 128 transfers the semiconductor wafer 302 from the semiconductor processing tool 104 to the transport carrier 106. In some implementations, the closed gas circulation system 112 may be operated for a time duration prior to the transfer of the semiconductor wafer 302 so that the closed gas circulation system 112 is permitted to achieve a steady state of operation. This permits the relative humidity and the oxygen concentration in the chamber 110 to be reduced to acceptable levels before the semiconductor wafer 302 is transferred.

As shown in FIG. 3D, the wafer transport tool 128 may obtain the semiconductor wafer 302 from the semiconductor processing tool 104 through the opening 132 in the chamber 110. As shown in FIG. 3E, the wafer transport tool 128 may retract the semiconductor wafer through the opening 132 and into the chamber 110. As shown in FIG. 3F, the wafer transport tool 128 may provide the semiconductor wafer 302 to the transport carrier 106 through the opening 130.

As shown in FIG. 3G, the door 126 of the transport carrier 106 may be placed back onto the housing 124 of the transport carrier 106 to close the door 126 after the semiconductor wafer 302 has been transferred to the transport carrier 106. The controller 122 may determine that the door 126 has been closed and placed or installed back onto the housing 124. For example, the controller 122 may determine that the door 126 has been closed and placed or installed back onto the housing 124 based on sensor data (e.g., proximity sensor data), associated with the position of the door 126, received from the one or more sensors 146.

As shown in FIG. 3H, the controller 122 may automatically cease operation of the closed gas circulation system 112 based on determining that the door 126 has been placed or installed back onto the housing 124. For example, the controller 122 may automatically cause the closed gas circulation system 112 to stop providing the supply flow 134 of gas from the sealed plenum 114 to the chamber 110 through the FFU inlet 120. The controller 122 may also deactivate one or more of the FFU inlet 120, the one or more vacuum pumps 142, and/or the circulation fans 118.

As indicated above, FIGS. 3A-3H are provided as an example. Other examples may differ from what is described with regard to FIGS. 3A-3H.

Figure 4A:
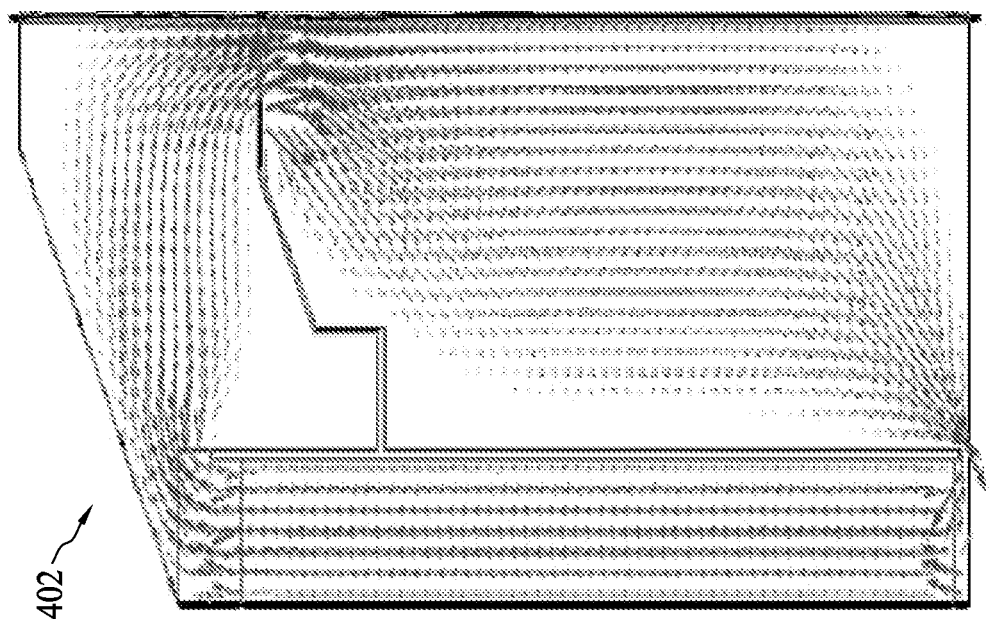
FIGS. 4A and 4B are diagrams of example air-flow patterns in an interface tool described herein.
Figure 4B:
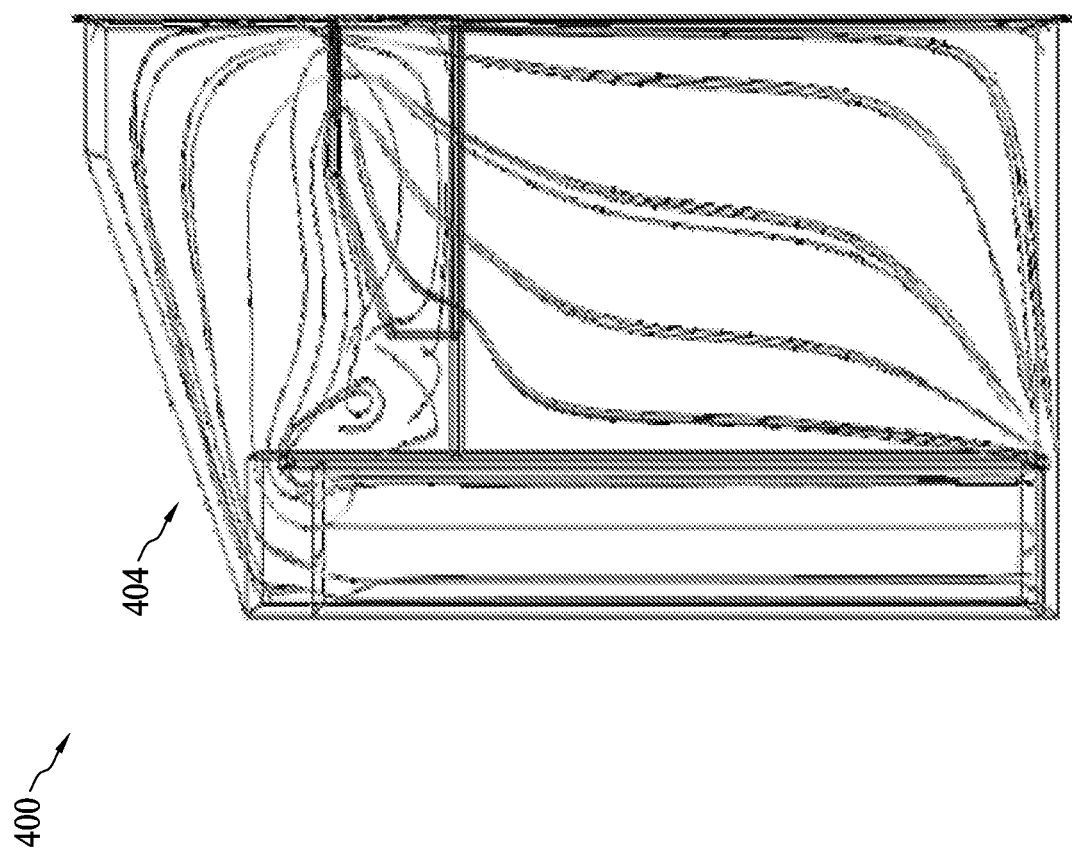

FIGS. 4A and 4B are diagrams of example air-flow patterns 400 in an interface tool described herein. FIG. 4A illustrates a vector flow pattern 402 and FIG. 4B illustrates a streamline flow pattern 404. As shown by the vector flow pattern 402 and the streamline flow pattern 404, gas is suppled from the sealed plenum 114 to the chamber 110 through the FFU inlet 120. The gas flowing out of the FFU inlet 120 may be slightly turbulent. The gas from the FFU inlet 120 may flow into the air-flow rectifier 136, which collimates the gas into the laminar flow 138 downward through the chamber 110 and toward the inlet into the sealed plenum 114.

As indicated above, FIGS. 4A and 4B are provided as examples. Other examples may differ from what is described with regard to FIGS. 4A and 4B.

Figure 5:
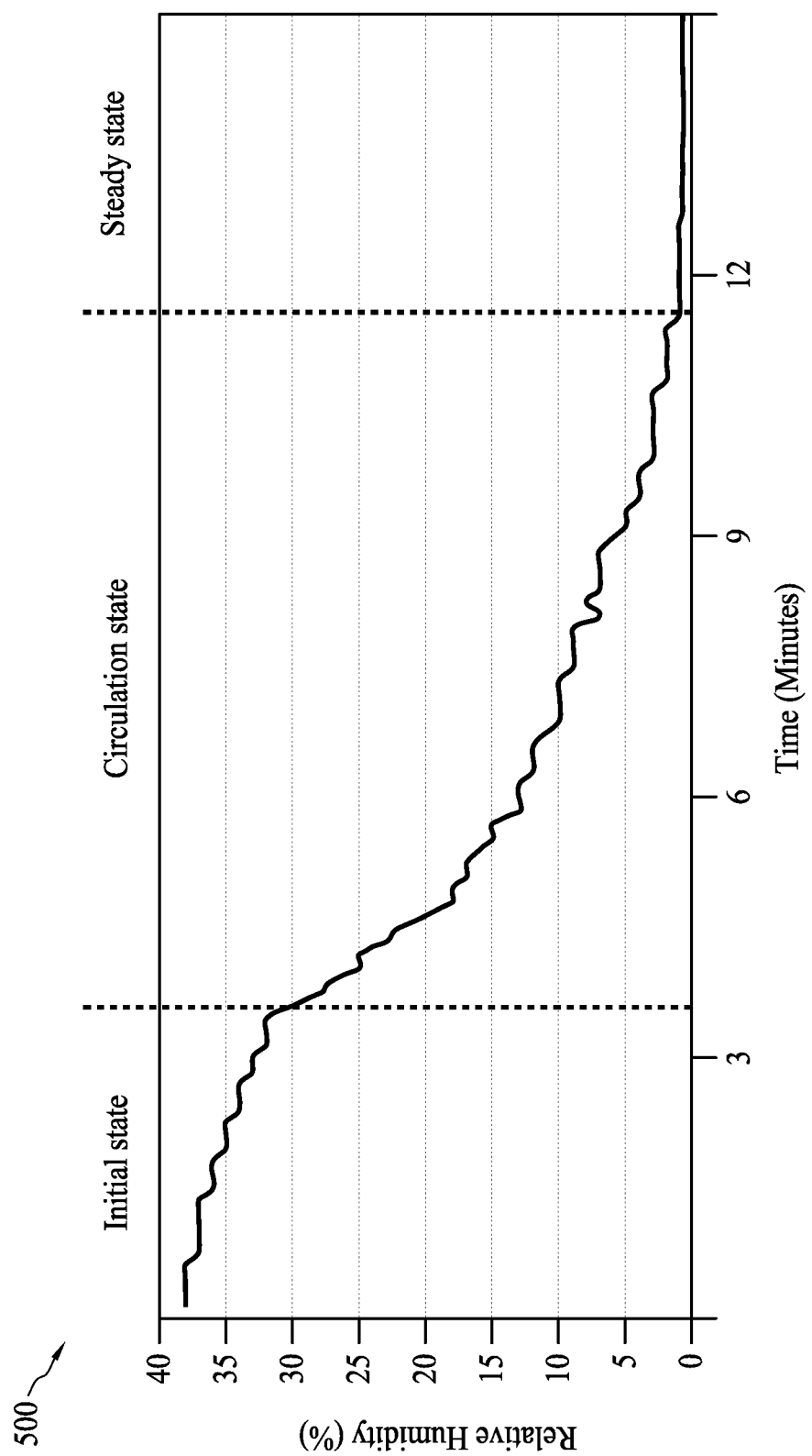
FIG. 5 is a diagram of an example operation timeline of a closed gas circulation system described herein.

FIG. 5 is a diagram of an example operation timeline 500 of the closed gas circulation system 112 described herein. The example operation timeline 500 may illustrate the change in relative humidity in the chamber 110 during operation of the closed gas circulation system.

As shown in FIG. 5, the relative humidity in the chamber 110 may gradually decrease from an initial state of operation of the closed gas circulation system 112 to a steady-state operation of the closed gas circulation system 112. The initial state of operation may refer to a time period in which operation of the closed gas circulation system 112 is initiated. The circulation state may refer to a time period of operation in which gas is circulated through the closed gas circulation system 112 and through the chamber 110 to remove humidity from the chamber 110 until the closed gas circulation system 112 reaches the steady-state operation in which the relative humidity in the chamber is stabilized.

As indicated above, FIG. 5 is provided as an example. Other examples may differ from what is described with regard to FIG. 5.

Figure 6:
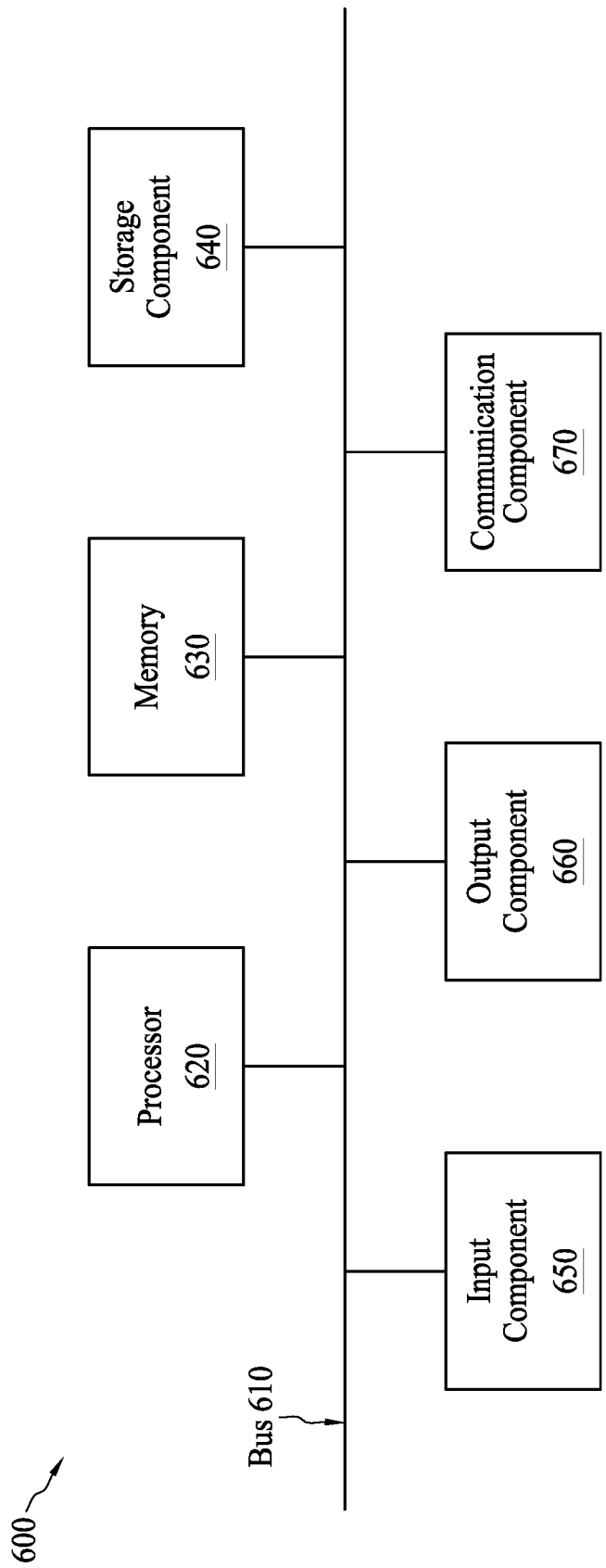
FIG. 6 is a diagram of example components of one or more devices of FIGS. 1A-1C.

FIG. 6 is a diagram of example components of a device 600, which may correspond to the controller 122 and/or one or more components of the closed gas circulation system 112. In some implementations, the controller 122 and/or the one or more components of the closed gas circulation system 112 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
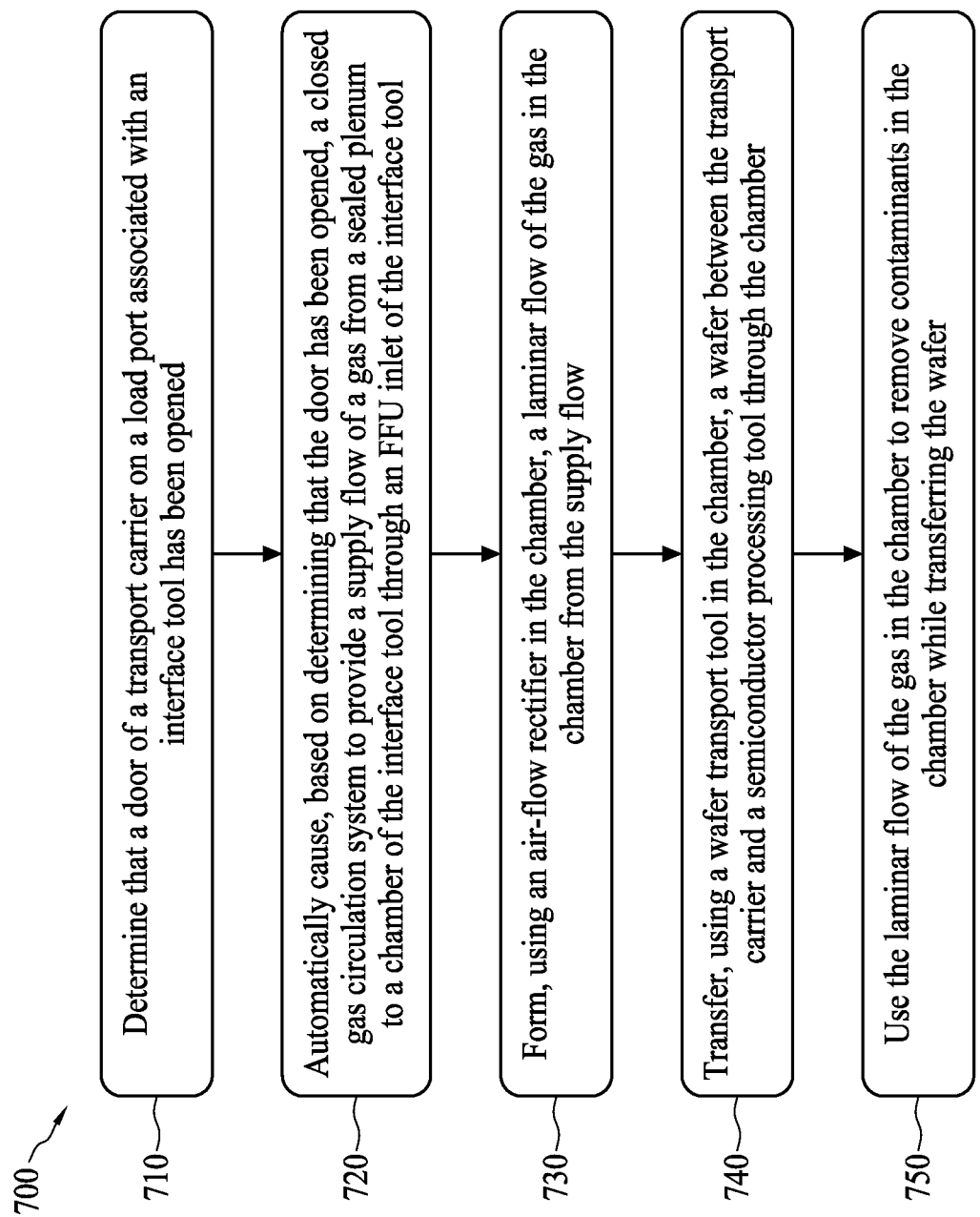
FIG. 7 is a flowchart of example process relating to accessing a transport carrier.

FIG. 7 is a flowchart of an example process 700 associated with accessing a transport carrier. In some implementations, one or more process blocks of FIG. 7 may be performed by a controller (e.g., controller 122). In some implementations, one or more process blocks of FIG. 7 may be performed by another device or a group of devices separate from or including the controller, such as a closed gas circulation system (e.g., the closed gas circulation system 112), a wafer transport tool (e.g., the wafer transport tool 128), and/or another device. Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include determining that a door of a transport carrier on a load port associated with an interface tool has been opened (block 710). For example, the controller 122 may determine that the door 126 of the transport carrier 106 on the load port 108 associated with the interface tool 102 has been opened, as described above.

As further shown in FIG. 7, process 700 may include automatically causing, based on determining that the door has been opened, a closed gas circulation system to provide a supply flow of a gas from a sealed plenum to a chamber of the interface tool through an FFU inlet of the interface tool (block 720). For example, the controller 122 may automatically cause, based on determining that the door 126 has been opened, the closed gas circulation system 112 to provide the supply flow 134 of a gas from the sealed plenum 114 to the chamber 110 of the interface tool 102 through the FFU inlet 120 of the interface tool 102, as described above.

As further shown in FIG. 7, process 700 may include forming, using an air-flow rectifier in the chamber, a laminar flow of the gas in the chamber from the supply flow (block 730). For example, the closed gas circulation system 112 may form, using the air-flow rectifier 136 in the chamber 110, the laminar flow 138 of the gas in the chamber 110 from the supply flow 134, as described above.

As further shown in FIG. 7, process 700 may include transferring, using a wafer transport tool in the chamber, a wafer between the transport carrier and a semiconductor processing tool through the chamber (block 740). For example, the interface tool 102 may transfer, using the wafer transport tool 128 in the chamber 110, a wafer (e.g., the semiconductor wafer 202, the semiconductor wafer 302) between the transport carrier 106 and the semiconductor processing tool 104 through the chamber 110, as described above.

As further shown in FIG. 7, process 700 may include using the laminar flow of the gas in the chamber to remove contaminants in the chamber while transferring the wafer (block 750). For example, the closed gas circulation system 112 may use the laminar flow 138 of the gas in the chamber 110 to remove contaminants in the chamber 110 while transferring the wafer, as described above.

Process 700 may include additional implementations, such as any single implementation or any combination of implementations described below and/or in connection with one or more other processes described elsewhere herein.

In a first implementation, transferring the wafer between the transport carrier includes transferring the wafer from the transport carrier to the semiconductor processing tool through the chamber. In a second implementation, alone or in combination with the first implementation, process 700 includes determining, after the wafer has been transferred between the transport carrier and the semiconductor processing tool, that the door of the transport carrier has been closed, and automatically causing, based on determining that the door has been closed, the closed gas circulation system to stop providing the supply flow of the gas from the sealed plenum to the chamber.

In a third implementation, alone or in combination with one or more of the first and second implementations, process 700 includes determining, using the controller and based on sensor data received from a relative humidity sensor (e.g., the one or more sensors 146) of the closed gas circulation system, that a relative humidity in the chamber does not satisfy a relative humidity threshold, and adjusting, using the controller and based on determining that the relative humidity in the chamber does not satisfy the relative humidity threshold, a flow speed of the laminar flow of the gas in the chamber to satisfy the relative humidity threshold. In a fourth implementation, alone or in combination with one or more of the first through third implementations, adjusting the flow speed includes adjusting, using the controller and based on sensor data received from an anemometer (e.g., the one or more sensors 146) of the closed gas circulation system, a butterfly damper position of a vacuum pump (e.g., the one or more vacuum pumps 142) included in the closed gas circulation system to adjust the flow speed.

In a fifth implementation, alone or in combination with one or more of the first through fourth implementations, automatically causing the closed gas circulation system to provide the supply flow of the gas from the sealed plenum to the chamber includes causing one or more circulation fans (e.g., one or more of the circulation fans 118) in the sealed plenum to provide the supply flow of the gas from the sealed plenum to the chamber. In a sixth implementation, alone or in combination with one or more of the first through fifth implementations, transferring the wafer between the transport carrier includes transferring the wafer from the semiconductor processing tool to the transport carrier through the chamber.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
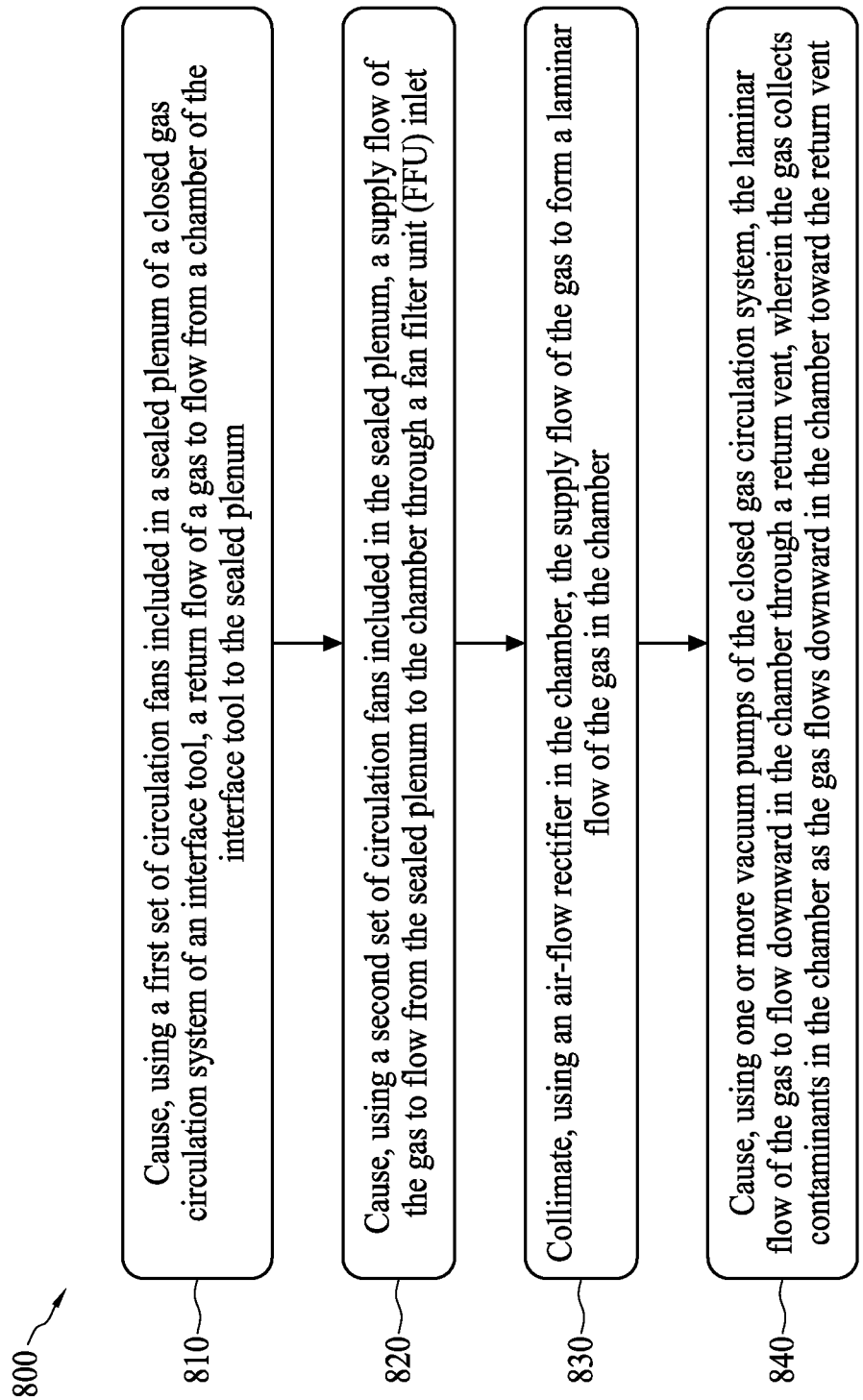
FIG. 8 is a flowchart of example process relating to operating a closed gas circulation system.

FIG. 8 is a flowchart of an example process 800 associated with operating a closed gas circulation system. In some implementations, one or more process blocks of FIG. 8 may be performed by a closed gas circulation system (e.g., the closed gas circulation system 112). In some implementations, one or more process blocks of FIG. 8 may be performed by another device or a group of devices separate from or including the interface tool, such as an interface tool (e.g., the interface tool 102), a wafer transport tool (e.g., the wafer transport tool 128), a controller (e.g., the controller 122), and/or another device. Additionally, or alternatively, one or more process blocks of FIG. 8 may be performed by one or more components of device 600, such as processor 620, memory 630, storage component 640, input component 650, output component 660, and/or communication component 670.

As shown in FIG. 8, process 800 may include causing, using a first set of circulation fans included in a sealed plenum of a closed gas circulation system of an interface tool, a return flow of a gas to flow from a chamber of the interface tool to the sealed plenum (block 810). For example, the closed gas circulation system 112 may cause, using a first set of circulation fans 118a and 118b included in the sealed plenum 114 of the closed gas circulation system 112 of the interface tool 102, a return flow 144 of a gas to flow from the chamber 110 of the interface tool 102 to the sealed plenum 114, as described above.

As further shown in FIG. 8, process 800 may include causing, using a second set of circulation fans included in the sealed plenum, a supply flow of the gas to flow from the sealed plenum to the chamber through an FFU inlet (block 820). For example, the closed gas circulation system 112 may cause, using a second set of circulation fans 118c and 118d included in the sealed plenum 114, the supply flow 134 of the gas to flow from the sealed plenum 114 to the chamber 110 through the FFU inlet 120, as described above.

As further shown in FIG. 8, process 800 may include collimating, using an air-flow rectifier in the chamber, the supply flow of the gas to form a laminar flow of the gas in the chamber (block 830). For example, the closed gas circulation system 112 may collimate, using the air-flow rectifier 136 in the chamber 110, the supply flow 134 of the gas to form the laminar flow 138 of the gas in the chamber 110, as described above.

As further shown in FIG. 8, process 800 may include causing, using one or more vacuum pumps of the closed gas circulation system, the laminar flow of the gas to flow downward in the chamber through a return vent, where the gas collects contaminants in the chamber as the gas flows downward in the chamber toward the return vent (block 840). For example, the closed gas circulation system 112 may cause, using the one or more vacuum pumps 142 of the closed gas circulation system 112, the laminar flow 138 of the gas to flow downward in the chamber 110 through the return vent 140, as described above. In some implementations, the gas collects contaminants in the chamber 110 as the gas flows downward in the chamber 110 toward the return vent 140.

Process 800 may include additional implementations, such as any single implementation or any combination of implementations described below and/or in connection with one or more other processes described elsewhere herein.

In a first implementation, the FFU inlet filters the contaminants from the gas. In a second implementation, alone or in combination with the first implementation, the return vent includes a plurality of zones (e.g., zones 140a, 140b, and 140c), where each of the plurality of zones includes respective pluralities of apertures through which the gas flows into the return flow, and where each of the respective pluralities of apertures includes a different aperture size to facilitate the laminar flow of the gas.

In a third implementation, alone or in combination with one or more of the first and second implementations, process 800 includes determining, using a controller (e.g., the controller 122) and based on sensor data received from an anemometer (e.g., the one or more sensors 146) of the closed gas circulation system, that a flow speed of the laminar flow of the gas in the chamber is not within a flow speed range, and adjusting, using the controller and based on determining that the flow speed is not within the flow speed range, a negative pressure differential in the chamber such that the flow speed is adjusted to be within the flow speed range. In a fourth implementation, alone or in combination with one or more of the first through third implementations, the flow speed range is from approximately 0.1 meters per second to approximately 1 meter per second. In a fifth implementation, alone or in combination with one or more of the first through fourth implementations, the gas includes an XCDA gas, or an $N_2$ gas.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a closed gas circulation system may include a sealed plenum, circulation fans, and an FFU inlet to contain, filter, condition, and re-circulate a gas through a chamber of an interface tool. The gas provided to the chamber is maintained in a conditioned environment in the closed gas circulation system as opposed to introducing external air into the chamber through the FFU inlet. This enables precise control over the relative humidity and oxygen concentration of the gas used in the chamber, which reduces the oxidation of semiconductor wafers that are transferred through the chamber. The closed gas circulation system may also include an air-flow rectifier, a return vent, and one or more vacuum pumps to form a downflow of collimated gas in the chamber and to automatically control the feed-forward pressure and flow of gas through the chamber and the sealed plenum. The downflow of collimated gas in the chamber may reduce turbulence within the chamber and may increase the contamination collecting efficiency of the gas circulated through the chamber.

As described in greater detail above, some implementations described herein provide a method. The method includes determining that a door of a transport carrier on a load port associated with an interface tool has been opened. The method includes automatically causing, based on determining that the door has been opened, a closed gas circulation system to provide a supply flow of a gas from a sealed plenum to a chamber of the interface tool through an FFU inlet of the interface tool. The method includes forming, using an air-flow rectifier in the chamber, a laminar flow of the gas in the chamber from the supply flow. The method includes transferring, using a wafer transport tool in the chamber, a wafer between the transport carrier and a semiconductor processing tool through the chamber. The method includes using the laminar flow of the gas in the chamber to remove contaminants in the chamber while transferring the wafer.

As described in greater detail above, some implementations described herein provide an interface tool. The interface tool includes a chamber. The interface tool includes a wafer transport tool in the chamber. The interface tool includes a closed gas circulation system. The closed gas circulation system includes a sealed plenum external to the chamber and at least partially surrounding the chamber. The closed gas circulation system includes an air-flow rectifier to collimate a supply flow of a gas from the sealed plenum into the chamber. The closed gas circulation system includes a vacuum pump to cause the gas to flow downward in the chamber to collect contaminants in the chamber. The closed gas circulation system includes a return vent, including a plurality of zones each having different sized apertures through the return vent, to facilitate a laminar flow of the gas downward in the chamber. The closed gas circulation system includes one or more circulation fans in the sealed plenum to collect the gas through the return vent and to provide a return flow of the gas to the sealed plenum.

As described in greater detail above, some implementations described herein provide a method. The method includes causing, using a first set of circulation fans included in a sealed plenum of a closed gas circulation system of an interface tool, a return flow of a gas to flow from a chamber of the interface tool to the sealed plenum. The method includes causing, using a second set of circulation fans included in the sealed plenum, a supply flow of the gas to flow from the sealed plenum to the chamber through an FFU inlet. The method includes collimating, using an air-flow rectifier in the chamber, the supply flow of the gas to form a laminar flow of the gas in the chamber. The method includes causing, using one or more vacuum pumps of the closed gas circulation system, the laminar flow of the gas to flow downward in the chamber through a return vent, where the gas collects contaminants in the chamber as the gas flows downward in the chamber toward the return vent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   determining that a door of a transport carrier on a load port associated with an interface tool has been opened;
   causing, based on determining that the door has been opened, a plurality of circulation fans, of a closed gas circulation system and located in a sealed plenum surrounding a chamber of the interface tool, to provide a supply flow of a gas from the sealed plenum to the chamber through a fan filter unit (FFU) inlet, of the interface tool, comprising a filter,
      wherein the plurality of circulation fans includes a first circulation fan, located at a first side of the sealed plenum that is adjacent to a first side of the chamber, and a second circulation fan, located at a second side of the sealed plenum that is adjacent to a second side of the chamber;
   forming, using an air-flow rectifier in the chamber, a laminar flow of the gas in the chamber from the supply flow;
   transferring, using a wafer transport tool in the chamber, a wafer between the transport carrier and a semiconductor processing tool through the chamber; and
   removing contaminants in the chamber, while transferring the wafer, using:
      the laminar flow of the gas in the chamber,
      a return vent, of the closed gas circulation system, that is located entirely inside of the chamber and that is located below the wafer transport tool or the air-flow rectifier, and
      a vacuum pump, of the closed gas circulation system, located outside of the chamber.

2. The method of claim 1, wherein transferring the wafer between the transport carrier and the semiconductor processing tool comprises:
   transferring the wafer from the transport carrier to the semiconductor processing tool through the chamber.

3. The method of claim 1, further comprising:
   determining, after the wafer has been transferred between the transport carrier and the semiconductor processing tool, that the door of the transport carrier has been closed; and
   causing, based on determining that the door has been closed, the closed gas circulation system to stop providing the supply flow of the gas from the sealed plenum to the chamber.

4. The method of claim 1, further comprising:
   determining, using a controller and based on sensor data received from a relative humidity sensor of the closed gas circulation system, that a relative humidity in the chamber does not satisfy a relative humidity threshold; and
   adjusting, using the controller and based on determining that the relative humidity in the chamber does not satisfy the relative humidity threshold, a flow speed of the laminar flow of the gas in the chamber to satisfy the relative humidity threshold.

5. The method of claim 4, wherein adjusting the flow speed comprises:
   adjusting, using the controller and based on sensor data received from an anemometer of the closed gas circulation system, a butterfly damper position of the vacuum pump to adjust the flow speed.

6. The method of claim 1, wherein transferring the wafer between the transport carrier and the semiconductor processing tool comprises:
transferring the wafer from the semiconductor processing tool to the transport carrier through the chamber.

7. An interface tool, comprising:
a chamber;
a wafer transport tool in the chamber; and
a closed gas circulation system comprising:
  a sealed plenum external to the chamber and at least partially surrounding the chamber;
  an air-flow rectifier to collimate a supply flow of a gas from the sealed plenum into the chamber;
  a vacuum pump, located outside of the chamber, to cause the gas to flow downward in the chamber to collect contaminants in the chamber;
  a return vent, located entirely inside of the chamber and located below the wafer transport tool and the air-flow rectifier, the return vent including a plurality of zones each having different sized apertures through the return vent, to facilitate a laminar flow of the gas downward in the chamber; and
  one or more circulation fans in the sealed plenum to:
    collect the gas through the return vent, and
    provide a return flow of all of the gas to the sealed plenum.

8. The interface tool of claim 7, wherein the sealed plenum is sealed to prevent mixing of the gas with external air of an environment in which the interface tool is located to satisfy a relative humidity threshold for the gas and an oxygen concentration threshold for the gas.

9. The interface tool of claim 7, wherein a size of the apertures increases across the plurality of zones from a first side of the chamber to a second side of the chamber opposing the first side to facilitate the laminar flow of the gas downward into the chamber.

10. The interface tool of claim 7, wherein the vacuum pump is configured to generate a negative pressure differential in the chamber in a range of approximately −0.1 Pascals to approximately −10 Pascals.

11. The interface tool of claim 7, wherein the one or more circulation fans comprises a first circulation fan, located at a first side of the sealed plenum that is adjacent to a first side of the chamber, and a second circulation fan, located at a second side of the sealed plenum that is adjacent to a second side of the chamber.

12. The interface tool of claim 7, wherein the closed gas circulation system further comprises:
  one or more sensors to obtain sensor data associated with one or more operating parameters of the closed gas circulation system; and
  a controller to:
    receive the sensor data; and
    adjust at least one of the one or more operating parameters based on the sensor data.

13. The interface tool of claim 12, wherein the one or more sensors comprise at least two of:
  a pressure sensor,
  a flow rate meter,
  a relative humidity sensor,
  an oxygen sensor, or
  an anemometer.

14. A method, comprising:
  causing, using a first set of circulation fans included in a sealed plenum of a closed gas circulation system of an interface tool, a return flow of a gas to flow from a chamber of the interface tool to the sealed plenum;
  causing, using a second set of circulation fans included in the sealed plenum, a supply flow of the gas to flow from the sealed plenum to the chamber through a fan filter unit (FFU) inlet;
  collimating, using an air-flow rectifier in the chamber, the supply flow of the gas to form a laminar flow of the gas in the chamber; and
  causing, using one or more vacuum pumps of the closed gas circulation system located outside the chamber, the laminar flow of all the gas to flow downward in the chamber through a return vent, located entirely inside of the chamber and located below the air-flow rectifier, and to the sealed plenum,
    wherein the gas collects contaminants in the chamber as the gas flows downward in the chamber toward the return vent.

15. The method of claim 14, wherein the gas comprises:
  an extreme clean dry air (XCDA) gas, or
  a nitrogen ($N_2$) gas.

16. The method of claim 14, wherein the FFU inlet filters the contaminants from the gas.

17. The method of claim 14, wherein the return vent includes a plurality of zones;
  wherein each of the plurality of zones includes respective pluralities of apertures through which the gas flows into the return flow; and
  wherein each of the respective pluralities of apertures includes a different aperture size to facilitate the laminar flow of the gas.

18. The method of claim 14, wherein each of the first set of circulation fans and the second set of circulation fans includes a first circulation fan, located at a first side of the sealed plenum that is adjacent to a first side of the chamber, and a second circulation fan, located at a second side of the sealed plenum that is adjacent to a second side of the chamber.

19. The method of claim 14, further comprising:
  receiving, using a controller of the closed gas circulation system, sensor data associated with one or more operating parameters of the closed gas circulation system; and
  adjusting using the controller, at least one of the one or more operating parameters based on the sensor data.

* * * * *